(12) United States Patent
Reiderman

(10) Patent No.: US 11,441,414 B2
(45) Date of Patent: Sep. 13, 2022

(54) DOWNHOLE NUCLEAR MAGNETIC RESONANCE (NMR) TOOL FOR ONE-DIMENSIONAL NMR IMAGING

(71) Applicant: Halliburton Energy Services, Inc., Houston, TX (US)

(72) Inventor: Arcady Reiderman, Richmond, TX (US)

(73) Assignee: Halliburton Energy Services, Inc., Houston, TX (US)

(*) Notice: Subject to any disclaimer, the term of this patent is extended or adjusted under 35 U.S.C. 154(b) by 1 day.

(21) Appl. No.: 16/336,865

(22) PCT Filed: Jan. 4, 2018

(86) PCT No.: PCT/US2018/012395
§ 371 (c)(1),
(2) Date: Mar. 26, 2019

(87) PCT Pub. No.: WO2019/135752
PCT Pub. Date: Jul. 11, 2019

(65) Prior Publication Data
US 2021/0123340 A1 Apr. 29, 2021

(51) Int. Cl.
*E21B 47/002* (2012.01)
*G01V 3/32* (2006.01)
*G01R 33/38* (2006.01)

(52) U.S. Cl.
CPC ...... *E21B 47/0025* (2020.05); *G01R 33/3808* (2013.01); *G01V 3/32* (2013.01)

(58) Field of Classification Search
CPC .............. G01N 24/081; G01R 33/3808; G01R 33/383; E21B 47/0025; G01V 3/32
See application file for complete search history.

(56) References Cited

U.S. PATENT DOCUMENTS 6,268,726 B1    7/2001  Prammer et al.
6,459,263 B2   10/2002  Hawkes et al.
(Continued)

FOREIGN PATENT DOCUMENTS

EP       0977057       2/2000

OTHER PUBLICATIONS

ISRWO International Search Report and Written Opinion for PCT/US2018/012395 dated Oct. 8, 2018.

*Primary Examiner* — Rishi R Patel
(74) *Attorney, Agent, or Firm* — Benjamin Ford; C. Tumey Law Group PLLC

(57) ABSTRACT

A nuclear magnetic resonance (NMR) tool includes an antenna assembly and a magnet assembly. The NMR tool also includes a motional sensor comprising at least one radio frequency (RF) antenna disposed about a tool axis and about at least a portion of the magnet assembly, in which the motional sensor is operable to generate readings for lateral motion of the antenna assembly and the magnet assembly. The at least one RF antenna has a soft magnetic core and a coil winding disposed around the soft magnetic core. The motional sensor can determine a one-dimensional NMR image indicating a lateral displacement of the NMR tool based on one or more spatial positions of NMR excitation volumes in the region of interest that correspond to respective excitation frequencies in the at least one RF antenna.

6 Claims, 17 Drawing Sheets

(56) References Cited

U.S. PATENT DOCUMENTS

| | | |
|---|---|---|
| 6,531,868 B2 * | 3/2003 | Prammer ............. G01N 24/081 |
| | | 324/303 |
| 6,566,874 B1 | 5/2003 | Speier et al. |
| 7,180,287 B2 | 2/2007 | Rottengatter et al. |
| 7,268,547 B2 | 9/2007 | Kruspe et al. |
| 7,339,374 B2 | 3/2008 | Blanz |
| 7,358,725 B2 | 4/2008 | Blanz |
| 7,733,086 B2 | 6/2010 | Prammer et al. |
| 8,941,383 B2 | 1/2015 | Hopper et al. |
| 9,377,557 B2 | 6/2016 | Reiderman et al. |
| 2004/0119471 A1 * | 6/2004 | Blanz ..................... G01R 33/62 |
| | | 324/303 |
| 2015/0061664 A1 | 3/2015 | Reiderman et al. |
| 2015/0061665 A1 * | 3/2015 | Reiderman .............. G01V 3/32 |
| | | 324/303 |
| 2016/0033670 A1 * | 2/2016 | Reiderman .............. G01V 3/32 |
| | | 324/303 |
| 2016/0202384 A1 | 7/2016 | Utsuzawa et al. |
| 2017/0176626 A1 * | 6/2017 | Paulsen .................... G01V 3/32 |
| 2017/0176628 A1 * | 6/2017 | Paulsen .................... G01V 3/32 |

* cited by examiner

DOWNHOLE NUCLEAR MAGNETIC RESONANCE (NMR) TOOL FOR ONE-DIMENSIONAL NMR IMAGING

TECHNICAL FIELD

The present description relates in general to downhole measurement systems, and more particularly to, for example, without limitation, downhole nuclear magnetic resonance (NMR) tool for one-dimensional NMR imaging.

BACKGROUND

Downhole NMR sensors (e.g., "inside out" sensors) have a relatively small radial extent of the sensitivity area making NMR well logging data sensitive to lateral (radial) motion of the tool. In case of NMR logging while drilling (LWD) and/or measuring while drilling (MWD), the lateral motion (vibration) along with rotation may cause severe distortion of the NMR data and even inability to acquire a spin echo signal representing transversal NMR relaxation. While rotational sensitivity may be reduced/eliminated by making an essentially axially symmetrical design of the sensor, the longitudinal and lateral displacement due to tool motion (vibration) remains an unsolved problem for NMR LWD and/or MWD.

BRIEF DESCRIPTION OF THE DRAWINGS

For a detailed description of the embodiments of the invention, reference will now be made to the accompanying drawings in which.

DETAILED DESCRIPTION

In one or more embodiments, a nuclear magnetic resonance (NMR) tool for use in a wellbore and a method for obtaining NMR data in the wellbore are provided. The NMR tool can be an oil well logging apparatus to measure NMR properties of earth formations in a subterranean region of interest. The NMR tool includes an antenna assembly, a magnet assembly, a compensating assembly, and one or more motion sensors. The motion sensor includes a magnetic pole and at least two RF antennae positioned about the South Pole region of the magnetic pole. Each of the RF antennae includes a coil wound about a magnetic core.

The NMR tool moves along the axis of the wellbore through a subterranean region. Radial or lateral motion of the tool, e.g., due to vibration, is an undesired effect that introduces a measurement error of the NMR data due to the static magnetic field variation in the NMR sensitivity region. The radial or lateral motion is relative to the axis of the NMR tool that is usually aligned or substantially aligned with the axis of the wellbore. Traditional approaches in obtaining lateral displacement data were based on using accelerometers or other mechanical sensor data that do not offer adequate accuracy of measurement. The subject technology provides for a motion sensor that facilitates in reducing the lateral motional effects in NMR measurements by using a 1D NMR imaging technique to obtain real-time data on lateral displacement of the NMR tool.

Figure 1A:
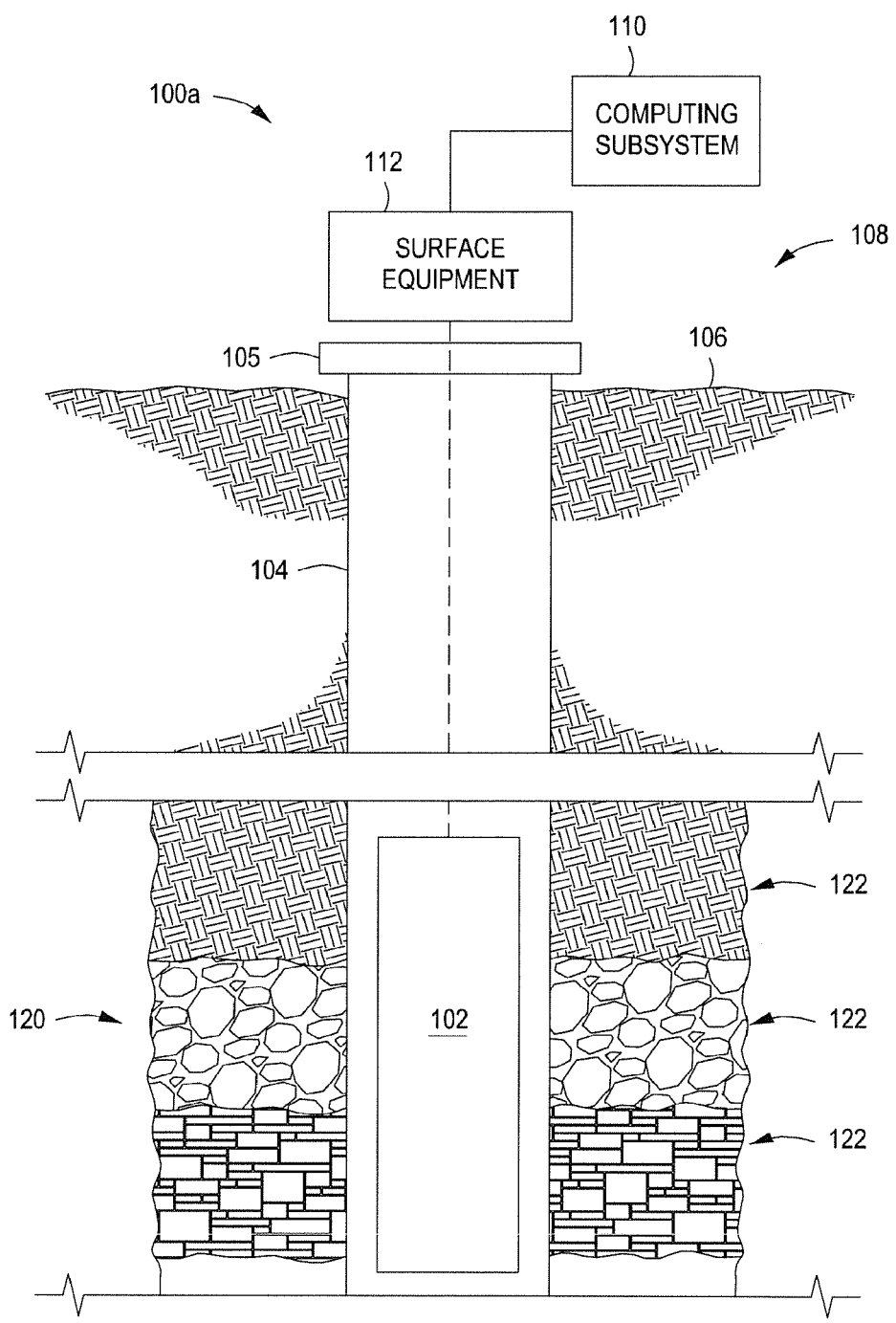
FIGS. 1A-1C illustrate schematic views of different examples of nuclear magnetic resonance (NMR) logging operations and/or systems in a well system in accordance with one or more implementations.

FIG. 1A depicts a schematic view of a NMR logging operation deployed in and around a well system 100a in accordance with one or more implementations. The well system 100a includes an NMR logging system 108 and a subterranean region 120 beneath the ground surface 106. The well system 100a can also include additional or different features that are not shown in FIG. 1A. For example, the well system 100a can include additional drilling system components, wireline logging system components, or other components.

The subterranean region 120 includes all or part of one or more subterranean formations or zones. The subterranean region 120 shown in FIG. 1A, for example, includes multiple subsurface layers 122. The subsurface layers 122 can include sedimentary layers, rock layers, sand layers, or any combination thereof and other types of subsurface layers. One or more of the subsurface layers can contain fluids, such as brine, oil, gas, or combinations thereof. A wellbore 104 penetrates through the subsurface layers 122. Although the wellbore 104 shown in FIG. 1A is a vertical wellbore, the NMR logging system 108 can also be implemented in other wellbore orientations. For example, the NMR logging system 108 may be adapted for horizontal wellbores, slant wellbores, curved wellbores, vertical wellbores, or any combination thereof.

The NMR logging system 108 also includes a logging tool 102, surface equipment 112, and a computing subsystem 110. In the shown in FIG. 1A, the logging tool 102 is a downhole logging tool that operates while disposed in the wellbore 104. The surface equipment 112 shown in FIG. 1A operates at or above the surface 106, for example, near the well head 105, to control the logging tool 102 and possibly other downhole equipment or other components of the well system 100*a*. The computing subsystem 110 receives and analyzes logging data from the logging tool 102. An NMR logging system can include additional or different features, and the features of an NMR logging system can be arranged and operated as represented in FIG. 1A or in another manner.

All or part of the computing subsystem 110 can be implemented as a component of; or integrated with one or more components of, the surface equipment 112, the logging tool 102, or both. For example, the computing subsystem 110 can be implemented as one or more computing structures separate from but communicative with the surface equipment 112 and the logging tool 102.

The computing subsystem 110 can be embedded in the logging tool 102 (not shown), and the computing subsystem 110 and the logging tool 102 operate concurrently while disposed in the wellbore 104. For example, although the computing subsystem 110 is shown above the surface 106 in FIG. 1A, all or part of the computing subsystem 110 may reside below the surface 106, for example, at or near the location of the logging tool 102.

The well system 100*a* includes communication or telemetry equipment that allows communication among the computing subsystem 110, the logging tool 102, and other components of the NMR logging system 108. For example, each of the components of the NMR logging system 108 can include one or more transceivers or similar apparatus for wired or wireless data communication among the various components. The NMR logging system 108 can include, but is not limited to, one or more systems and/or apparatus for wireline telemetry, wired pipe telemetry, mud pulse telemetry, acoustic telemetry, electromagnetic telemetry, or any combination of these and other types of telemetry. In some embodiments, the logging tool 102 receives commands, status signals, or other types of information from the computing subsystem 110 or another source. The computing subsystem 110 can also receive logging data, status signals, or other types of information from the logging tool 102 or another source.

NMR logging operations are performed in connection with various types of downhole operations at various stages in the lifetime of a well system and therefore structural attributes and components of the surface equipment 112 and logging tool 102 are adapted for various types of NMR logging operations. For example, NMR logging may be performed during drilling operations, during wireline logging operations, or in other contexts. As such, the surface equipment 112 and the logging tool 102 can include or operate in connection with drilling equipment, wireline logging equipment, or other equipment for other types of operations.

Figure 1B:
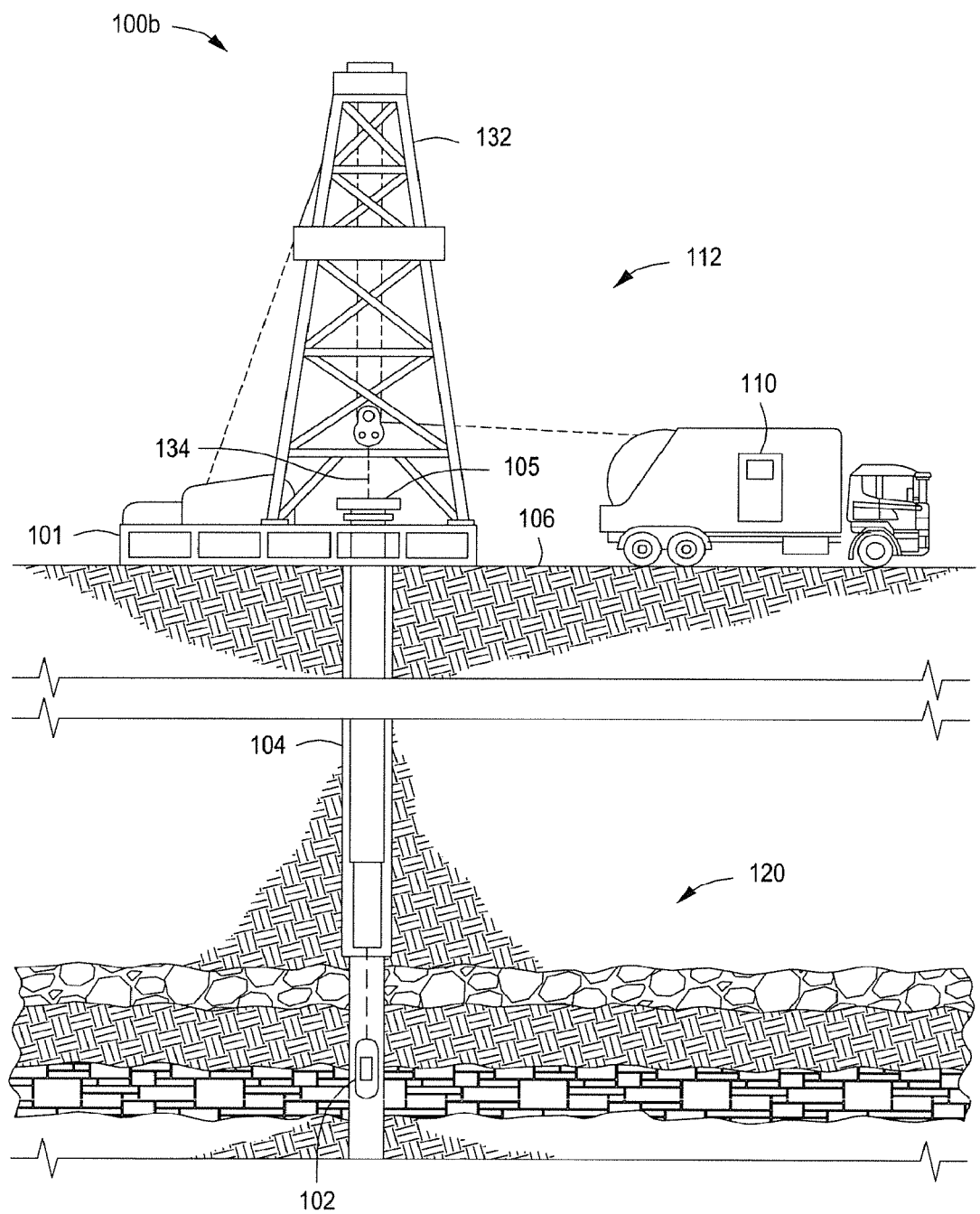

FIG. 1B depicts a schematic view of a wireline NMR logging operation deployed in and around a well system 100*b* in accordance with one or more implementations. The well system 100*b* includes the NMR logging tool 102 in a wireline logging environment. The surface equipment 112 includes, but is not limited to, a platform 101 disposed above the surface 106 equipped with a derrick 132 that supports a wireline cable 134 extending into the wellbore 104. Wireline logging operations are performed, for example, after a drill string is removed from the wellbore 104, to allow the wireline logging tool 102 to be lowered by wire line or logging cable into the wellbore 104.

Figure 1C:
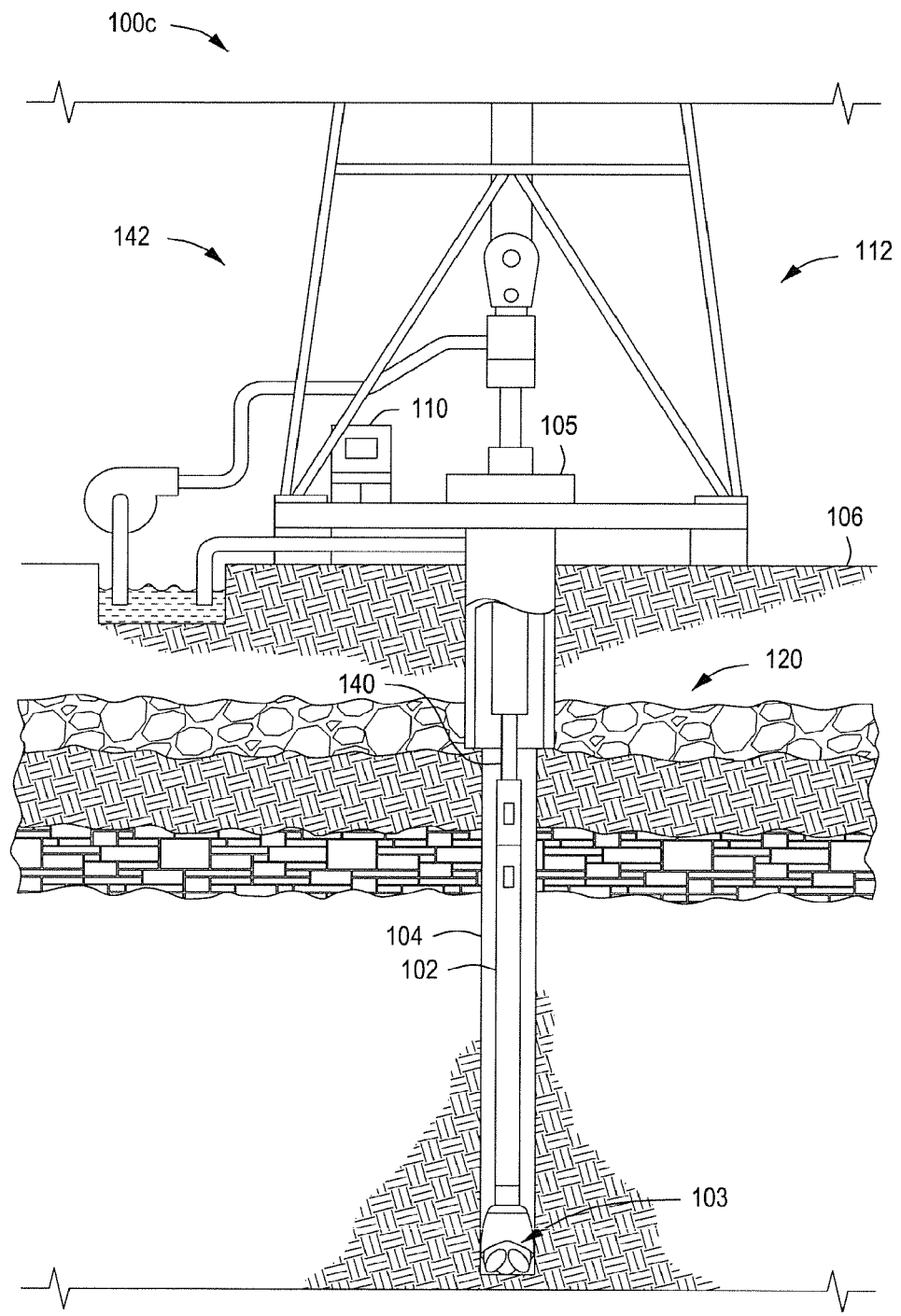

FIG. 1C depicts a schematic view of a well system 100*c* that includes the NMR logging tool 102 in a logging while drilling (LWD) environment in accordance with one or more implementations. NMR logging operations is performed during drilling operations. Drilling is performed using a string of drill pipes connected together to form a drill string 140 that is lowered through a rotary table into the wellbore 104. A drilling rig 142 at the surface 106 supports the drill string 140, as the drill string 140 is operated to drill a wellbore penetrating the subterranean region 120. The drill string 140 can include, for example, but is not limited to, a kelly, a drill pipe, a bottom hole assembly, and other components. The bottomhole assembly on the drill string can include drill collars, drill bits, the logging tool 102, and other components. Exemplary logging tools can be or include, but are not limited to, measuring while drilling (MWD) tools and LWD tools.

The logging tool 102 includes an NMR tool for obtaining NMR measurements from the subterranean region 120. As shown, for example, in FIG. 1B, the logging tool 102 is suspended in the wellbore 104 by a coiled tubing, wireline cable, or another structure or conveyance that connects the tool to a surface control unit or other components of the surface equipment 112.

The logging tool 102 is lowered to the bottom of a region of interest and subsequently pulled upward (e.g., at a substantially constant speed) through the region of interest. As shown, for example, in FIG. 1C, the logging tool 102 is deployed in the wellbore 104 on jointed drill pipe, hard wired drill pipe, or other deployment hardware. In other example implementations, the logging tool 102 collects data during drilling operations as it moves downward through the region of interest. The logging tool 102 may also collect data while the drill string 140 is moving, for example, while the logging tool 102 is being tripped in or tripped out of the wellbore 104.

The logging tool 102 may also collect data at discrete logging points in the wellbore 104. For example, the logging tool 102 moves upward or downward incrementally to each logging point at a series of depths in the wellbore 104. At each logging point, instruments in the logging tool 102 perform measurements on the subterranean region 120. The logging tool 102 also obtains measurements while the logging tool 102 is moving (e.g., being raised or lowered). The measurement data is communicated to the computing subsystem 110 for storage, processing, and analysis. Such data may be gathered and analyzed during drilling operations (e.g., LWD operations), during wireline logging operations, other conveyance operations, or during other types of activities.

The computing subsystem 110 receives and analyzes the measurement data from the logging tool 102 to detect properties of various subsurface layers 122. For example, the computing subsystem 110 can identify the density, material content, and/or other properties of the subsurface layers 122 based on the NMR measurements acquired by the logging tool 102 in the wellbore 104.

The logging tool 102 obtains NMR signals by polarizing nuclear spins in the formation 120 and pulsing the nuclei with a radio frequency (RF) magnetic field. Various pulse sequences (i.e., series of radio frequency pulses, delays, and other operations) are used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the refocusing pulses are less than 180°, a saturation recovery pulse sequence, and other pulse sequences.

Figure 2A:
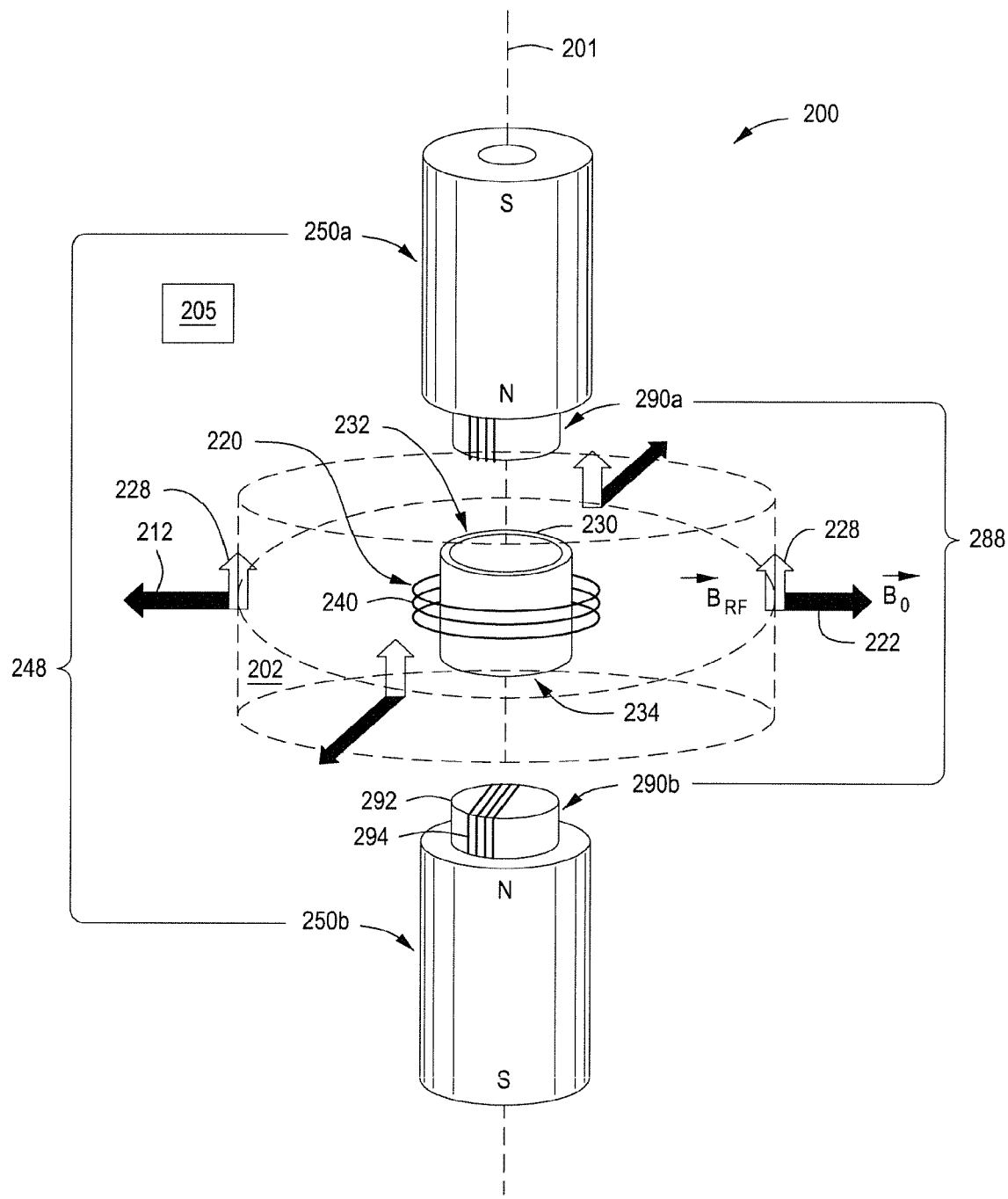
FIGS. 2A-2C illustrate schematic views of an NMR tool in accordance with one or more implementations.
Figure 2B:
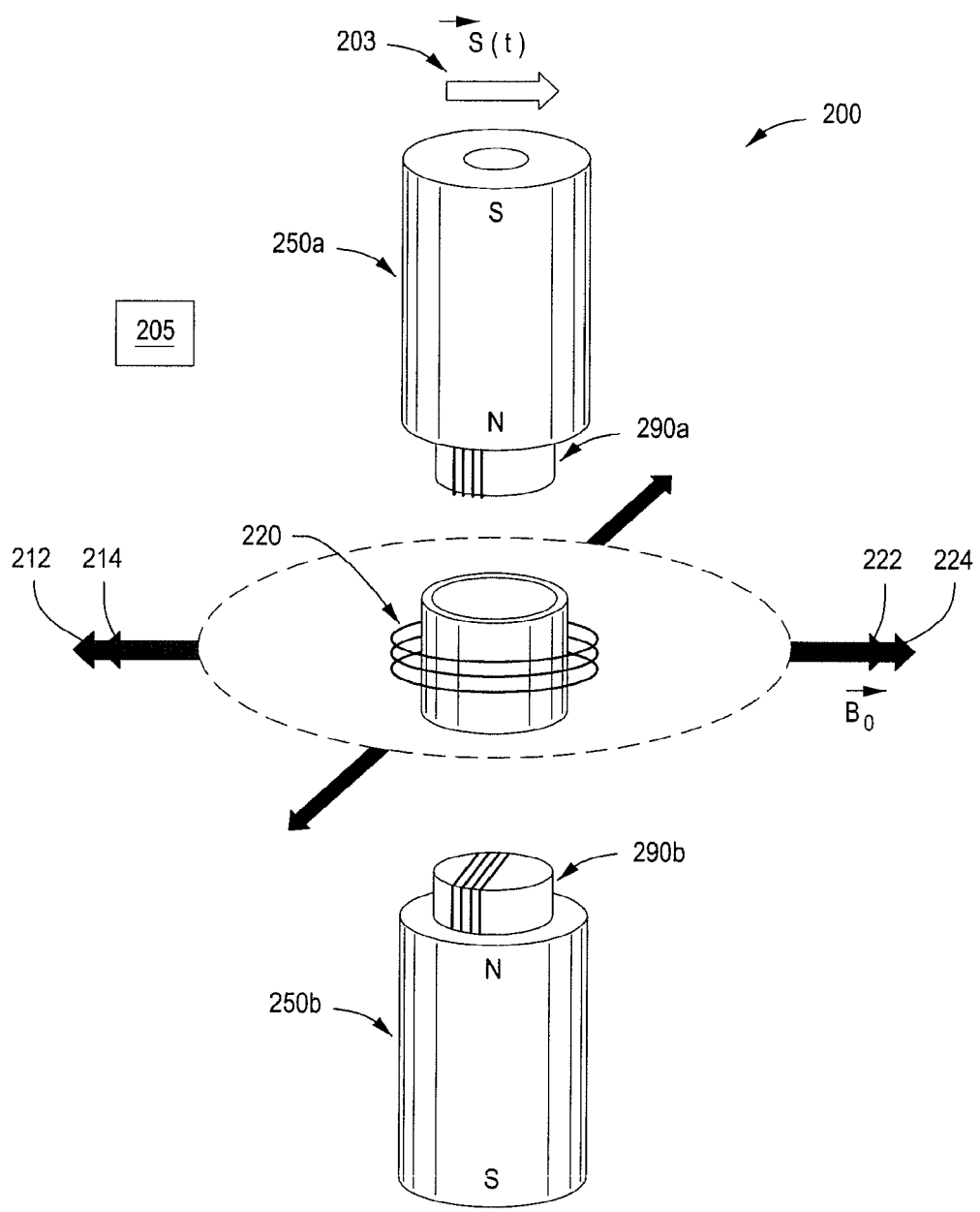
Figure 2C:
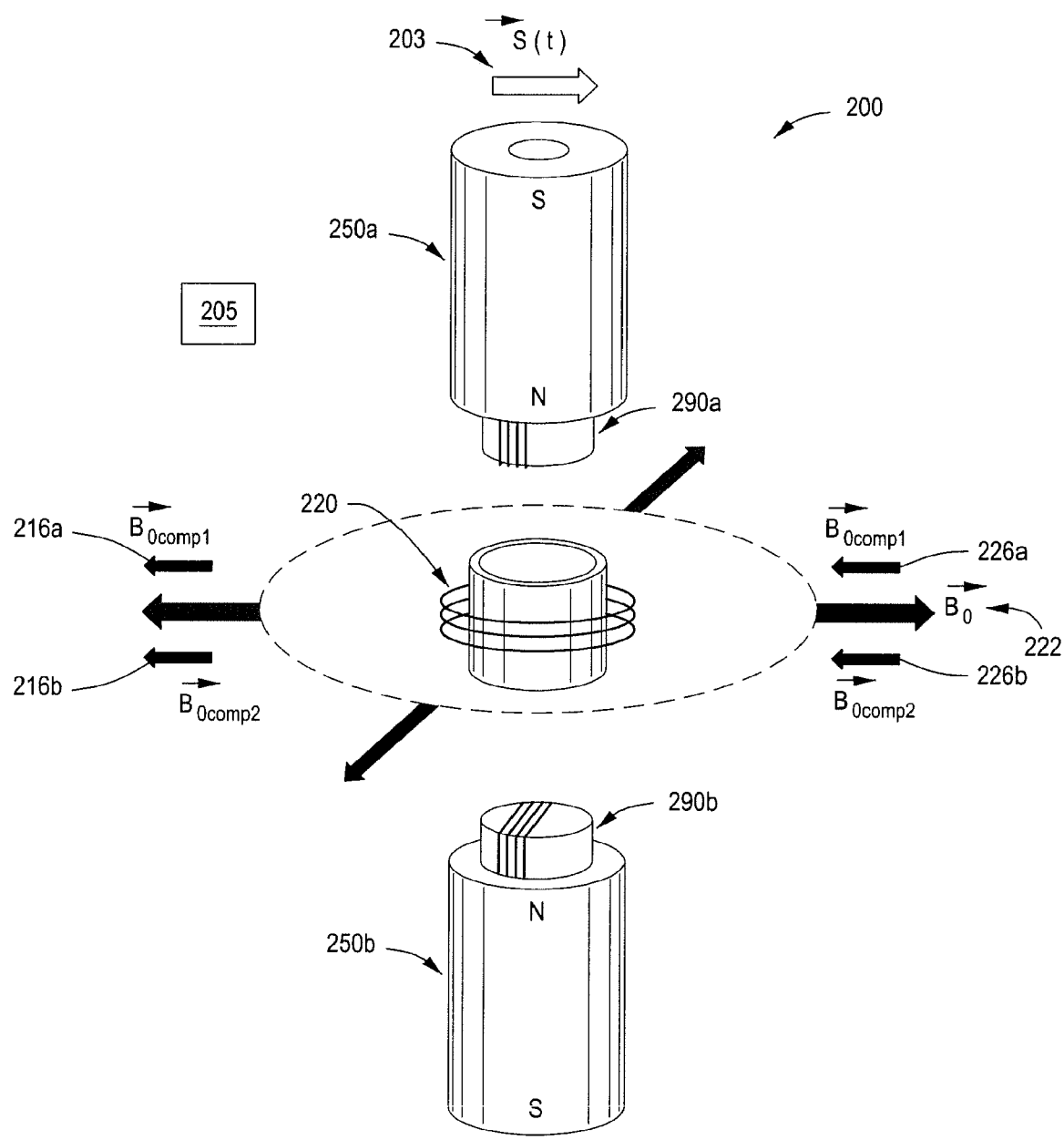

FIGS. 2A-2C depict schematic views of an NMR tool 200 at different intervals of use in accordance with one or more implementations. The NMR tool 200 includes, but is not limited to, one or more antenna assemblies 220, one or more magnet assemblies 248, and one or more compensating assemblies 288. In one or more embodiments, the NMR tool 200 can be or include the NMR logging tool 102, depicted in FIGS. 1A-1C, and can be used in the wellbore 104 with any or all components of the well systems 100a, 100b, and/or 100c, as discussed and described above. For example, a logging system located in or around any of the well systems 100a, 100b, or 100c, or another logging system, can include the NMR tool 200 operatively coupled to a wireline (not shown) and/or other components and used in the wellbore 104. FIG. 2A depicts the NMR tool 200 having no lateral movement, the antenna assembly 220 and the magnet assembly 248 activated and generating magnetic fields, and the compensating assembly 288 inactivated and not generating a magnetic field.

The antenna assembly 220 includes one or more antenna windings 240 at least partially or completely wound, disposed, or positioned circumferentially around a soft magnetic core 230 (e.g., three antenna windings 240 are depicted in FIGS. 2A-2C). The soft magnetic core 230 can contain one, two, or more permanent magnets positioned therein (not shown). The soft magnetic core 230 includes an upper axial end 232 opposite a lower axial end 234. The upper and lower axial ends 232, 234 are axially aligned about a common axis 201 of the NMR tool 200.

The magnet assembly 248 includes at least two end magnets, such as an upper end magnet 250a and a lower end magnet 250b. The upper end magnet 250a is spaced apart from the upper axial end 232 of the soft magnetic core 230 and is axially aligned about the common axis 201. The lower end magnet 250b is spaced apart from the lower axial end 234 of the soft magnetic core 230 and is axially aligned about the common axis 201. The north poles of the end magnets 250a, 250b are facing toward the antenna assembly 220, as depicted in FIGS. 2A-2C. The antenna assembly 220 and the magnet assembly 248 produce or generate a static magnetic field (represented by arrows 212, 222) and a radio-frequency magnetic field (represented by arrows 228) within a volume 202 (e.g., volume of investigation) in a subterranean region.

The compensating assembly 288 includes an upper compensating electromagnet 290a and a lower compensating electromagnet 290b. The upper electromagnet 290a is located between the upper end magnet 250a and the upper axial end 232 of the soft magnetic core 230 and axially aligned about the common axis 201. The lower electromagnet 290b is located between the lower end magnet 250b and the lower axial end 234 of the soft magnetic core 230 and axially aligned about the common axis 201.

Figure 2D:
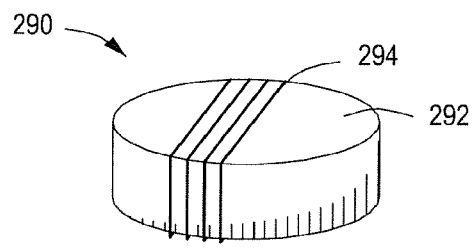
FIG. 2D illustrates a schematic view of a compensating electromagnet that can be used in an NMR tool in accordance with one or more implementations.
Figure 3:
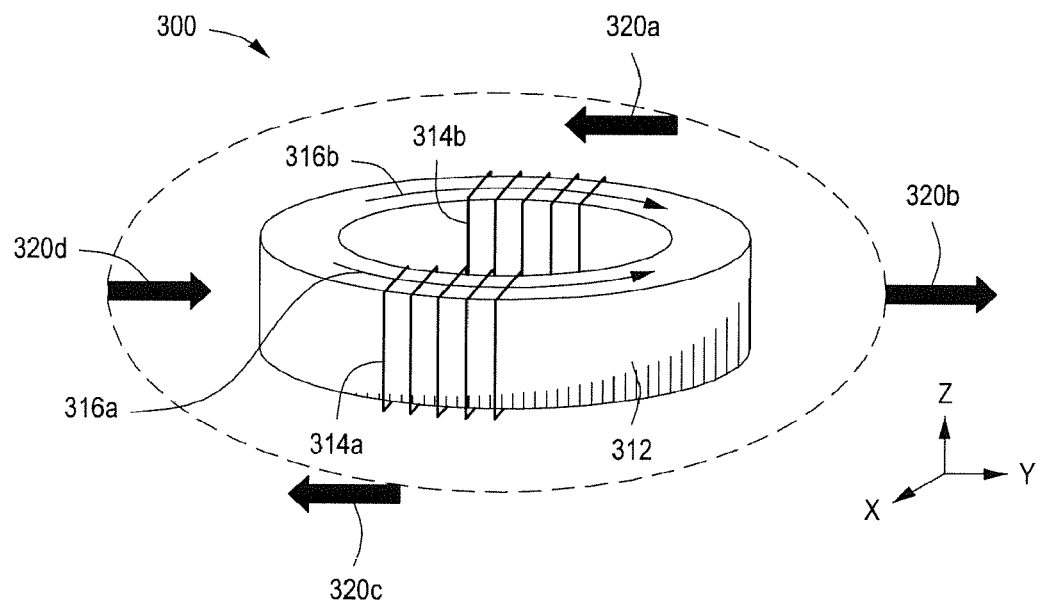
FIG. 3 illustrates a schematic view of another compensating electromagnet that can be used in an NMR tool in accordance with one or more implementations.

Each of the upper electromagnet 290a and the lower electromagnet 290b includes one or more magnetic cores 292 and one, two, or more windings 294. The magnetic core 292 can be or contain a soft magnetic core. The windings 294 are at least partially or completely wound, disposed, or positioned around the magnetic core 292. For example, the windings 294 are wound around the upper, lower, and side surfaces of the magnetic core 292. Each of the windings 294 can be or include a single winding (as depicted in FIGS. 2A-2D), a two-section winding (as depicted in FIG. 3), two orthogonal, two-section windings (FIGS. 4A-4C and 5), or have other winding configurations, some of which will be further discussed below. For example, a compensating electromagnet 290 (also referred to as a compensating time varying dipole) includes a plurality of windings 294 at least partially or completely wound around the magnetic core 292, as depicted in FIG. 2D, can be used in the NMR tool 200, as well as other NMR tools discussed and described herein.

In another embodiment, depicted in FIG. 3, a compensating electromagnet 300 includes a plurality of windings 294 at least partially or completely wound the magnetic core 292, as depicted in FIG. 2D, can be used in the NMR tool 200, as well as other NMR tools discussed and described herein.

The upper end magnet 250a is positioned to have a north pole of the upper end magnet 250a facing toward the upper electromagnet 290a and the upper axial end 232 of the soft magnetic core 230. The lower end magnet 250b is positioned to have a north pole of the lower end magnet 250b facing toward the lower electromagnet 290b and the lower axial end 234 of the soft magnetic core 230. The upper end magnet 250a is positioned to have a south pole of the upper end magnet 250a facing away from the upper electromagnet 290a and the upper axial end 232 of the soft magnetic core 230. The lower end magnet 250b is positioned to have a south pole of the lower end magnet 250b facing away from the lower electromagnet 290b and the lower axial end 234 of the soft magnetic core 230.

FIG. 2B depicts the NMR tool 200 having lateral movement with the antenna assembly 220 and the magnet assembly 248 activated and generating magnetic fields and the compensating assembly 288 inactivated and not generating a magnetic field. The NMR tool 200 is depicted as laterally moved from left to right in FIG. 2B, as indicated by the lateral displacement vector $\vec{s}(t)$ at 203.

One type of NMR experiment that can be implemented downhole to acquire NMR relaxation parameters is a CPMG experiment containing exciting nuclei with a sequence of radio-frequency pulses starting with an excitation pulse followed by a plurality of refocusing pulses. An NMR signal is generated in response to the radio-frequency pulse sequence in a form of plurality of spin echoes occurring between the refocusing pulses. Due to lateral motion during the CPMG experiment the static magnetic field seen by excited nuclei on the right side (FIG. 2B) of the sensitive region increases from the static magnetic field shown at 222 to the static magnetic field shown at 224. The magnetic field at the opposite side of the sensitivity region decreases from the static magnetic field shown at 212 to the static magnetic field shown at 214.

The NMR tool 200 includes a compensating system 205 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool 200. The motion sensor can be or include, but is not limited to, one or more accelerometers, one or more gyroscopes, one or more magnetometers, or any combination thereof. The motion sensor generates or otherwise produces readings for lateral motion of the antenna assembly 220, the magnet assembly 248, and/or the NMR tool 200. The sensor data processing unit (not shown) generates a time varying value proportional to the lateral motion of the antenna assembly 220, the magnet assembly 248, and/or the NMR tool 200. For example, the motion sensor and the sensor data processing unit are used to determine at least the lateral displacement vector (t) 203 of the NMR tool 200 including the antenna assembly 220 and the magnet assembly 248.

FIG. 2C depicts the NMR tool 200 having or experiencing lateral movement with the antenna assembly 220 and the magnet assembly 248 activated and generating magnetic fields and the compensating assembly 288 also activated and generating magnetic fields. The compensating assembly 288 provides a lateral motion effect compensation using the upper and lower electromagnets 290a, 290b. For example, the upper and lower electromagnets 290a, 290b produce magnetic fields to compensate for the lateral motion of the NMR tool 200. The compensating assembly 288 is activated and reduces the static magnetic field 222 that has an increased field due to lateral motion of the antenna and magnet assemblies 220, 248, such as when the NMR tool 200 is moved. Also, the compensating assembly 288 is activated and increases the static magnetic field 222 that has a decreased field due to lateral motion of the antenna and magnet assemblies 220, 248. The effective dipole moment, $\vec{p}m(t)$, of the upper and lower electromagnets 290a, 290b is proportional to the lateral displacement, $\vec{s}(t)$, by the formula: $\vec{p}m(t) \propto \vec{s}(t)$. For example, the upper and lower electromagnets 290a, 290b can be activated to produce magnetic fields 226a, 226b that reduce the total static magnetic field that was increased due to the lateral motion of the antenna and magnet assemblies 220, 248 and increase the static magnetic field (additional magnetic field 216a, 216b) that was reduced due to the lateral motion of the antenna and magnet assemblies 220, 248. As a result, the magnetic field seen by the nuclei spins remains unchanged or substantially unchanged, as if the NMR tool 200 did not experience lateral motion.

The current driving the upper and lower electromagnets 290a, 290b are proportional to the motion sensor readings: $i(t) = \alpha \times \vec{s}(t)$, where the coefficient $\alpha$ can be determined during calibration of the magnetic field of the compensating assembly 288.

In one or more embodiments, the antenna assembly 220 generates a radio-frequency magnetic field and the magnet assembly 248 generates a static magnetic field. In one or more embodiments, the motion sensor in the compensating system 205 generates readings for the lateral motion of the antenna and magnet assemblies 220, 248 and the compensating assembly 288 includes at least one, two, or more electromagnets 290 driven by a source of electric current. In some examples, the at least one electromagnet 290 can be or include the upper and lower electromagnets 290a, 290b. The electric current can be generated relative or proportional to the readings from the motion sensor for the lateral motion. The compensating assembly 288 reduces or eliminates the static magnetic field variations in the region of interest due to lateral motion of the magnet assembly.

FIG. 3 depicts a schematic view of a compensating electromagnet 300 that is used in an NMR tool 200 or other NMR tools in accordance with one or more implementations.

The compensating electromagnet 300 includes a plurality of windings 314a, 314b (a two-section winding) at least partially wound, disposed, or positioned around a magnetic core 312, such as a soft magnetic core. The sections of the windings 314a, 314b connect to generate magnetic flux substantially in the same direction (shown by arrows 316a, 316b) —which makes the compensating electromagnet 300 an essentially Y-dipole, as depicted by the shown coordinate system. The magnetic field of the compensating electromagnet at the volume of investigation (surrounding the magnet/antenna assembly) is shown at arrows 320a, 320b, 320c, and 320d.

The range of magnetic field strength $\Delta B$ that is desired to be produced by the upper electromagnet 290a and the lower electromagnet 290b of the compensating assembly 288 can be determined by the static magnetic field gradient G at the volume 202 (e.g., volume of investigation) and the maximum expected lateral displacement $\Delta s$ via the equation $\Delta B = G \times \Delta s$. For example, if G is about 0.05 T/m and $\Delta s$ is about $5 \times 10^{-3}$ m, then the $\Delta B$ can be up to $2.5 \times 10^{-4}$ T. In one or more embodiments, the upper electromagnet 290a and the lower electromagnet 290b of the compensating assembly 288 generate the magnetic field strength from a power in a range from about 5 W to about 15 W, which is much less than the typical amount of power for generating a CPMG radio-frequency pulse sequence.

Figure 4A:
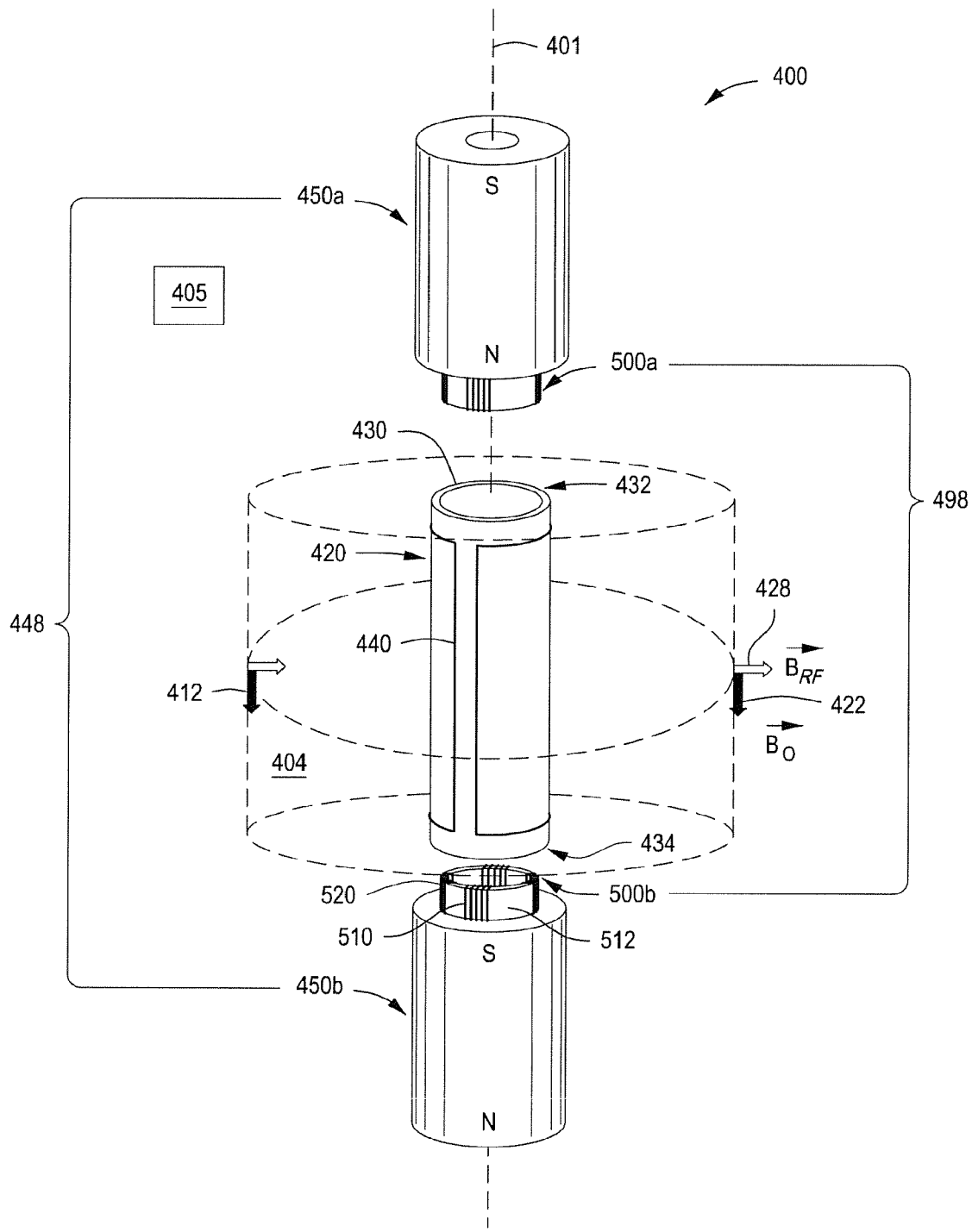
FIGS. 4A-4C illustrate a schematic view of another NMR tool in accordance with one or more implementations.
Figure 4B:
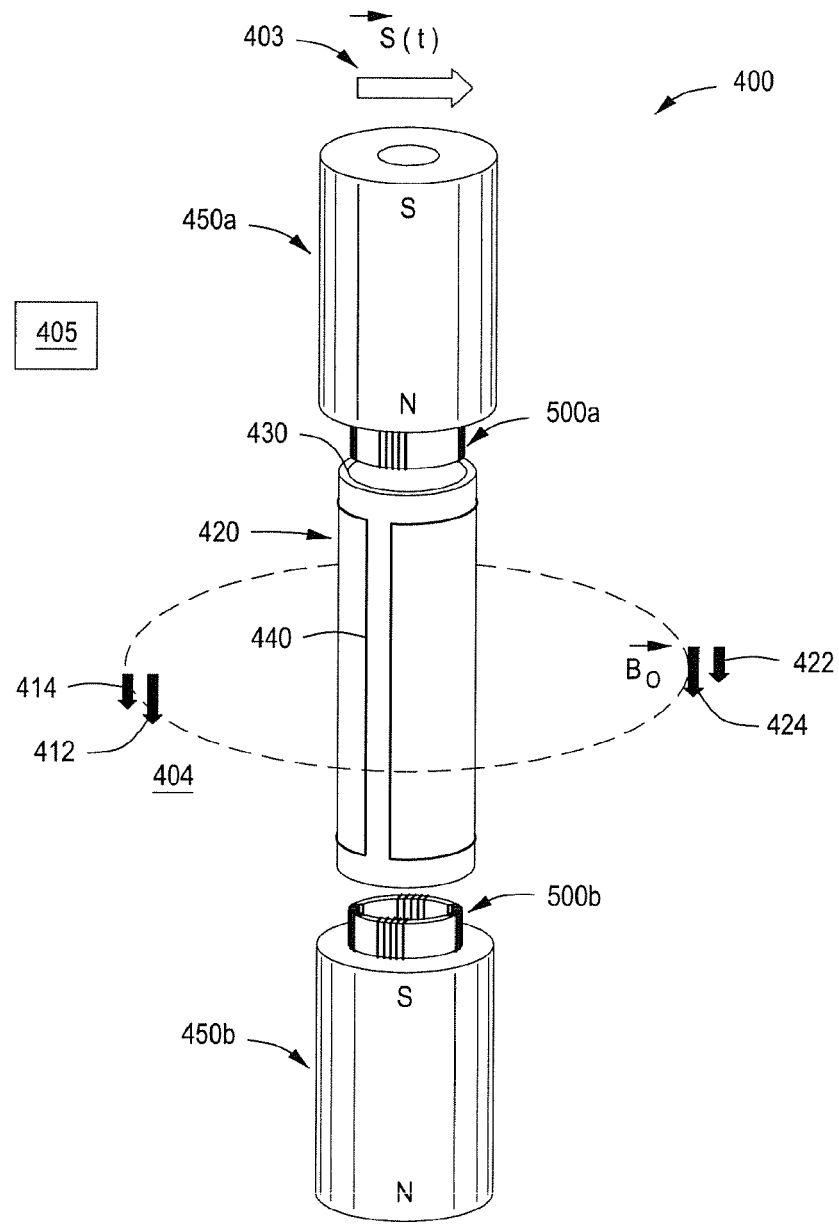
Figure 4C:
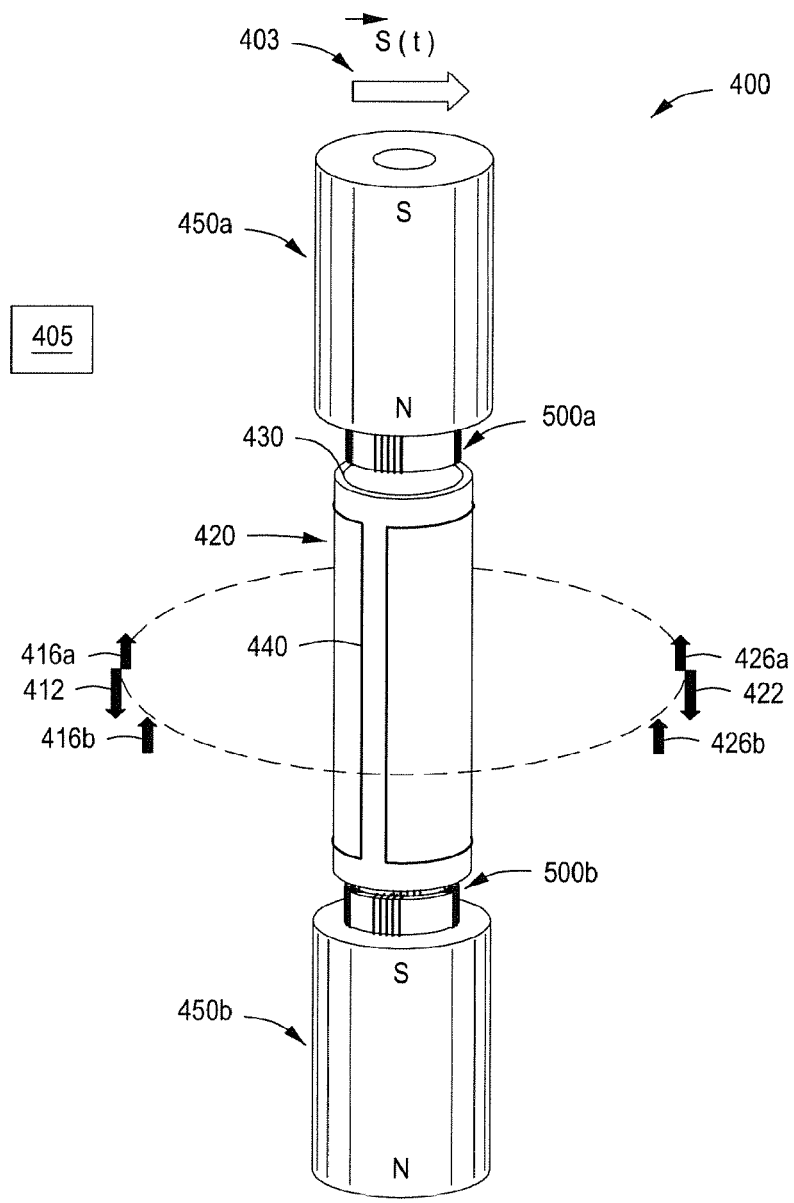

FIGS. 4A-4C depict schematic views of an NMR tool 400 at different intervals of use in accordance with one or more implementations. The NMR tool 400 can be or include a LWD NMR sensor assembly. The NMR tool 400 includes, but is not limited to, one or more antenna assemblies 420, one or more magnet assemblies 448, and one or more compensating assemblies 498. In one or more embodiments, the NMR tool 400 is or includes the NMR logging tool 102, depicted in FIGS. 1A-1C, and can be used in the wellbore 104 with any or all components of the well systems 100a, 100b, and/or 100c, as discussed and described above. For example, a logging system located in or around any of the well systems 100a, 100b, or 100c, or another logging system, can include the NMR tool 400 operatively coupled to a wireline (not shown) and/or other components and used in the wellbore 104. FIG. 4A depicts the NMR tool 400 having no lateral movement, the antenna assembly 420 and the magnet assembly 448 activated and generating magnetic fields, and the compensating assembly 498 inactivated and not generating a magnetic field.

The antenna assembly 420 includes one or more antenna windings 440 at least partially wound, disposed, or positioned circumferentially around a soft magnetic core 430. The soft magnetic core 430 can contain one, two, or more permanent magnets positioned therein (not shown). The soft magnetic core 430 includes an upper axial end 432 opposite a lower axial end 434. The upper and lower axial ends 432, 434 are axially aligned about a common axis 401 of the NMR tool 400.

The magnet assembly 448 includes at least two end magnets, such as an upper end magnet 450a and a lower end magnet 450b. The upper end magnet 450a is spaced apart from the upper axial end 432 of the soft magnetic core 430 and is axially aligned about the common axis 401. The lower end magnet 450b is spaced apart from the lower axial end 434 of the soft magnetic core 430 and is axially aligned about the common axis 401. The north pole of the end magnet 450a faces toward the south pole of the end magnet 450b and the antenna assembly 420 is disposed therebetween on the soft magnetic core 430, as depicted in FIGS. 4A-4C. Alternatively, not shown, the south pole of the end magnet 450a can face toward the north pole of the end magnet 450b and the antenna assembly 420 can be disposed therebetween. The antenna assembly 420 and the magnet assembly 448 produces or generates a static magnetic field (represented by arrows 412, 422) and a radio-frequency magnetic field (represented by arrows 428) within a volume 404 (e.g., volume of investigation) in a subterranean region.

The compensating assembly 498 includes an upper electromagnet 500a and a lower electromagnet 500b. The upper electromagnet 500a is located between the upper end magnet 450a and the upper axial end 432 of the soft magnetic core 430. The upper electromagnet 500a is axially aligned about the common axis 401. The lower electromagnet 500b is located between the lower end magnet 450b and the lower axial end 434 of the soft magnetic core 430. The lower electromagnet 500b is axially aligned about the common axis 401.

Figure 5:
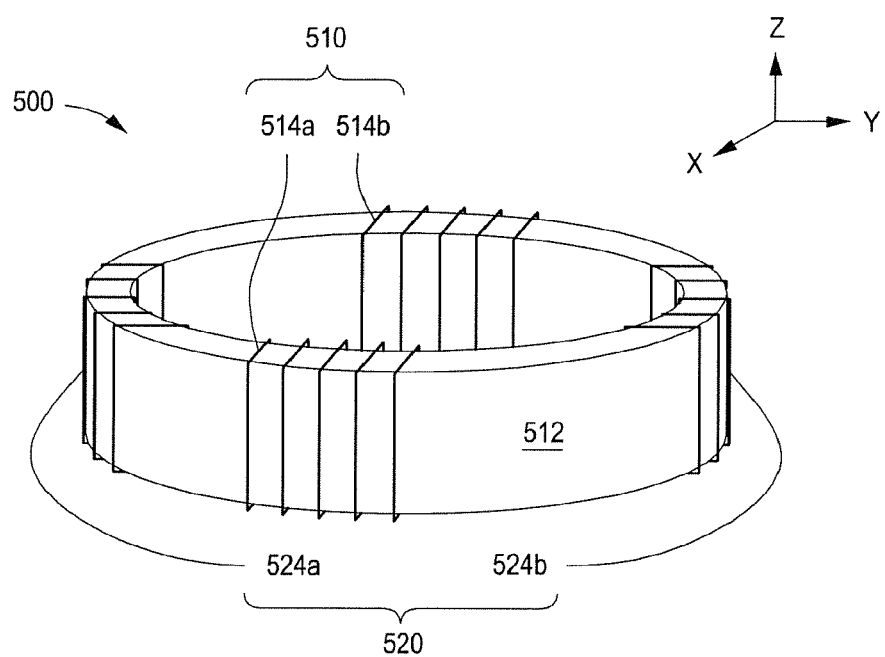
FIG. 5 illustrates a schematic view of another compensating electromagnet that can be used in an NMR tool in accordance with one or more implementations.

Each of the upper electromagnet 500a and the lower electromagnet 500b includes one or more magnetic cores 512 and one, two, or more windings 510, 520. The magnetic core 512 can be or contain a soft magnetic core. The windings 510, 520 is at least partially or completely wound, disposed, or positioned around the magnetic core 512. Each of the windings 510, 520 can be or include a single winding (as depicted in FIGS. 2A-2D), a two-section winding (as depicted in FIG. 3), two orthogonal, two section windings (as depicted in FIGS. 4A-4C and 5), or contain other winding configurations. For example, a compensating electromagnet 498 (e.g., compensating electromagnets 500a, 500b) that includes two orthogonal windings 510, 520 at least partially or completely wound, disposed, or positioned around the magnetic core 512, as depicted in FIG. 5, can be used in the NMR tool 500, as well as other NMR tools discussed and described herein.

The upper end magnet 450a is positioned to have a north pole of the upper end magnet 450a facing toward the upper electromagnet 500a and the upper axial end 432 of the soft magnetic core 430. The lower end magnet 450b is positioned to have a north pole of the lower end magnet 450b facing toward the lower electromagnet 500b and the lower axial end 434 of the soft magnetic core 430. The upper end magnet 450a is positioned to have a south pole of the upper end magnet 450a facing away from the upper electromagnet 500a and the upper axial end 432 of the soft magnetic core 430. The lower end magnet 450b is positioned to have a south pole of the lower end magnet 450b facing away from the lower electromagnet 500b and the lower axial end 434 of the soft magnetic core 430.

FIG. 4B depicts the NMR tool 400 having lateral movement with the antenna assembly 420 and the magnet assembly 448 activated and generating magnetic fields and the compensating assembly 488 inactivated and not generating a magnetic field. The NMR tool 400 is depicted as laterally moved from left to right in FIG. 4B, as indicated by the lateral displacement vector $\vec{s}(t)$ at 403.

The NMR tool 400 includes a compensating system 405 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool 400. The motion sensor can be or include, but is not limited to, one or more accelerometers, one or more gyroscopes, one or more magnetometers, or any combination thereof. The motion sensor generates or otherwise produces readings for lateral motion of the antenna assembly 420, the magnet assembly 448, and/or the NMR tool 400. The sensor data processing unit (not shown) generates a time varying value proportional to the lateral motion of the antenna assembly 420, the magnet assembly 448, and/or the NMR tool 400. For example, the motion sensor and the sensor data processing unit are used to determine at least the lateral displacement vector $\vec{s}(t)$ 403 of the NMR tool 400 including the antenna assembly 420 and the magnet assembly 448.

One type of NMR experiment that can be typically implemented downhole to acquire NMR relaxation parameters is a CPMG experiment containing exciting nuclei with a sequence of radio-frequency pulses starting with an excitation pulse followed by a plurality of refocusing pulses. An NMR signal is generated in response to the radio-frequency pulse sequence in a form of plurality of spin echoes occurring between the refocusing pulses. Due to lateral motion during the CPMG experiment, the static magnetic field seen by excited nuclei on the right side (FIG. 4B) of the sensitive region increases from the static magnetic field shown at 422 to the static magnetic field shown at 424. The magnetic field at the opposite side of the sensitivity region decreases from the static magnetic field shown at 412 to the static magnetic field shown at 414.

FIG. 4C depicts the NMR tool 400 having lateral movement with the antenna assembly 420 and the magnet assembly 448 activated and generating magnetic fields and the compensating assembly 498 also activated and generating magnetic fields. The compensating assembly 498 provides a lateral motion effect compensation using the compensating electromagnets 500a, 500b. For example, the upper and lower electromagnets 500a, 500b generate or produce magnetic fields to compensate for the lateral motion of the antenna and magnet assemblies 420, 448. The compensating assembly 498 reduces the static magnetic field 422 that has an increased field due to lateral motion of the antenna and magnet assemblies 420, 448, such as when the NMR tool 400 is moved. Also, the compensating assembly 498 increases the static magnetic field 422 that has a decreased field due to lateral motion of the antenna and magnet assemblies 420, 448. The effective dipole moment, $\vec{p}m(t)$, of the compensating electromagnets is proportional to the lateral displacement, $\vec{s}(t)$, by the formula:

$$\vec{p}m(t) \propto \vec{s}(t) \qquad \text{Equation(1)}.$$

For example, the upper and lower electromagnets 500a, 500b can be activated to produce magnetic fields 426a, 426b that reduce the total static magnetic field that was increased due to the lateral motion of the antenna and magnet assemblies 420, 448 and increase the static magnetic field (additional magnetic field 416a, 416b) that was reduced due to the lateral motion of the antenna and magnet assemblies 420, 448. As a result, the magnetic field seen by the nuclei spins remains unchanged or substantially unchanged, as if the NMR tool 400 did not experience lateral motion.

The current driving the upper and lower electromagnets 500a, 500b is proportional to the motion sensor readings, by the formula:

$$i(t) = \alpha \times \vec{s}(t) \qquad \text{Equation(2)},$$

where the coefficient $\alpha$ can be determined during calibration of the magnetic field of the compensating assembly 498.

It should be noted that the presence of the magnetic core may modify the static magnetic field of the magnet assembly. A magnetized magnetic core creates some minor magnetic poles near the ends of the core. Thus the strength of the magnetic pole of the magnet may be slightly reduced by the magnetic core and make the total magnetic pole ("charge") slightly smaller. Due to the direction of the magnetic field relative to the core axis this effect is smaller for the sensor or the NMR tool 200 depicted in FIG. 2C compared to the sensor or the NMR tool 400 depicted in FIG. 4C. Calibration of the compensating system removes the effect of the magnetic pole reduction due to presence of the magnetic core.

FIG. 5 depicts a schematic view of an electromagnet 500 (e.g., the upper electromagnet 500a, the lower electromagnet 500b, or other electromagnets) that can be used in the NMR tool 400, as well as other NMR tools in accordance with one or more implementations. The compensating electromagnet 500 includes windings 510, 520 at least partially or completely wound, disposed, or positioned around a magnetic core 512, such as a soft magnetic core. The windings 510, 520 can be two orthogonal windings such that the windings 510, 512 are orthogonally disposed from one another. In one or more embodiments, the winding 510 is a first two-section winding containing winding sections 514a, 514b and the winding 520 is a second two-section winding containing winding sections 524a, 524b, as depicted in FIG. 5.

The windings 510, 520 are used to compensate the magnetic field variation due to motion in any direction of the X-Y plane. The currents in the windings 510, 520 are determined by the following formulas:

$$i_1(t) = \alpha_1^x \cdot s_x(t) \quad \text{Equation(3) for winding 510, and}$$

$$i_2(t) = \alpha_2^x \cdot s_y(t) \quad \text{Equation (4) for winding 520,}$$

where $s_x(t)$ and $s_y(t)$ are the respective X and Y components of the lateral displacement; and $\alpha_1$ and $\alpha_2$ are coefficients that can be determined in calibration of the NMR tool.

Figure 6:
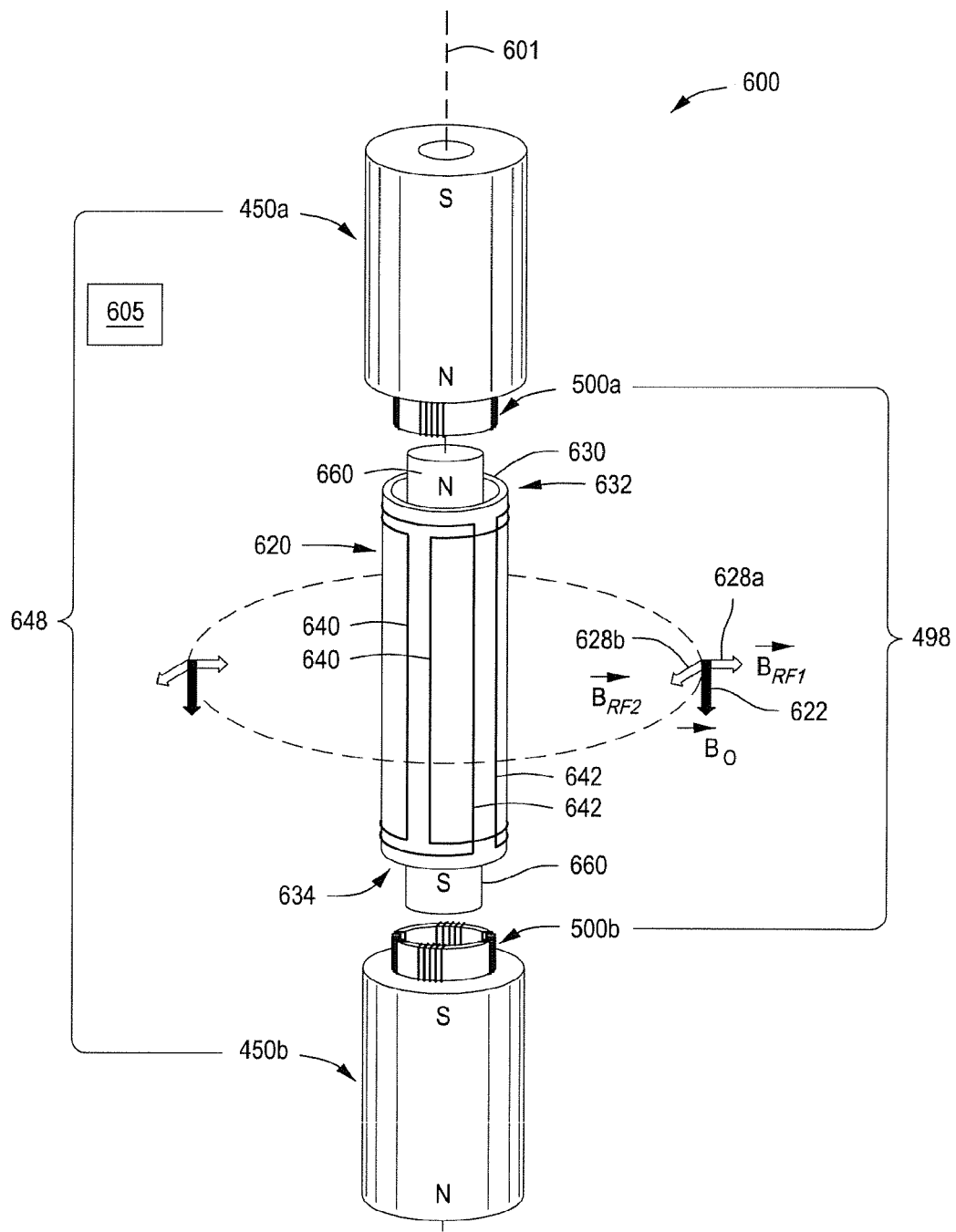
FIG. 6 illustrates a schematic view of another NMR tool in accordance with one or more implementations.

FIG. 6 depicts a schematic view of an NMR tool 600 in accordance with one or more implementations. The NMR tool 600 includes a magnet assembly having three magnets, an antenna assembly enabling circular polarization of the radio-frequency magnetic field, and two-coil detection. More specifically, the NMR tool 600 can include, but is not limited to, one or more antenna assemblies 620, one or more magnet assemblies 648 containing a central magnet 660, and one or more compensating assemblies 498. The NMR tool 600 can be or include an LWD NMR sensor. In one or more embodiments, the NMR tool 600 is or includes the NMR logging tool 102, depicted in FIGS. 1A-1C, and can be used in the wellbore 104 with any or all components of the well systems 100a, 100b, and/or 100c, as discussed and described above. For example, a logging system located in or around any of the well systems 100a, 100b, or 100c, or another logging system, can include the NMR tool 600 operatively coupled to a wireline (not shown) and/or other components and used in the wellbore 104.

The NMR tool 600, as depicted in FIG. 6, has no lateral movement, the antenna assembly 620 and the magnet assembly 648 are activated and generating magnetic fields, and the compensating assembly 698 is inactivated and not generating a magnetic field. The antenna assembly 620 includes antenna windings 640, 642 at least partially disposed around a soft magnetic core 630. The soft magnetic core 630 can contain one, two, or more permanent magnets positioned therein (not shown). The soft magnetic core 630 includes an upper axial end 632 opposite a lower axial end 634. The upper and lower axial ends 632, 634 are axially aligned about a common axis 601 of the NMR tool 600.

As depicted in FIG. 6, the antenna windings 640, 642 can be or include two orthogonal windings, such that the antenna winding 640 and the antenna winding 642 are orthogonally disposed about each other. The antenna assembly 620 generates or produces two orthogonal RF magnetic fields 628a, 628b. The RF magnetic field 628a is generated or produced by the windings 640 and the RF magnetic field 628b is generated or produced by the windings 642. The two RF magnetic fields 628a, 628b have a phase shift of about 90° and therefore a circular polarized RF magnetic field is generated to excite NMR. The antenna assembly 620 generates the RF magnetic field more efficiently relative to a similar antenna assembly having only a single antenna winding. The windings 640, 642 are used to receive NMR signal. The NMR signals induced in the orthogonal windings 640, 642 are then processed in order to increase the signal-to-noise ratio (SNR) of the acquired NMR data.

The magnet assembly 648 includes the upper and lower end magnets 450a, 450b and the central magnet 660. The upper end magnet 450a is spaced apart from the upper axial end 632 of the soft magnetic core 630 and is axially aligned about the common axis 601. The lower end magnet 450b is spaced apart from the lower axial end 634 of the soft magnetic core 630 and is axially aligned about the common axis 601. The central magnet 660 is also axially aligned with the common axis 601.

The central magnet 660 is arranged so that like poles of the central magnet 660 are facing the poles of the respective neighboring end magnets 450a, 450b. The north pole of the end magnet 450a is facing toward the north pole of the central magnet 660 and the south pole of the end magnet 450b is facing toward the south pole of the central magnet 660, as depicted in FIG. 6. Alternatively, not shown, the south pole of the end magnet 450a can be facing toward the south pole of the central magnet 660 and the north pole of the end magnet 450b can be facing toward the north pole of the central magnet 660. The static magnetic field produced by the two end magnets 450a, 450b and the central magnet 660 is represented by arrows 622. The central magnet 660 can be used to shape and/or strengthen the static magnetic field 622 in the volume of investigation.

The compensating assembly 698 includes an upper electromagnet 500a and a lower electromagnet 500b. The central magnet 660 is located between the upper and lower electromagnets 500a, 500b. In addition, the upper electromagnet 500a is located between the upper end magnet 450a and the upper axial end 632 of the soft magnetic core 630. The upper electromagnet 500a is axially aligned about the common axis 601. The lower electromagnet 500b is located between the lower end magnet 450b and the lower axial end 634 of the soft magnetic core 630. The lower electromagnet 500b is axially aligned about the common axis 601.

The upper end magnet 450a is positioned to have a north pole of the upper end magnet 450a facing toward the upper electromagnet 500a and the upper axial end 632 of the soft magnetic core 630. The lower end magnet 450b is positioned to have a north pole of the lower end magnet 450b facing toward the lower electromagnet 500b and the lower axial end 634 of the soft magnetic core 630. The upper end magnet 450a is positioned to have a south pole of the upper end magnet 450a facing away from the upper electromagnet 500a and the upper axial end 632 of the soft magnetic core 630. The lower end magnet 450b is positioned to have a south pole of the lower end magnet 450b facing away from the lower electromagnet 500b and the lower axial end 634 of the soft magnetic core 630.

The NMR tool 600 includes a compensating system 605 that contains, but is not limited to, one or more motion sensors, one or more sensor data processing units, a digital-to-analog converter (DAC), a power amplifier, a calibration system containing one or more magnetic field sensors, or any combination thereof. The one or more motion sensors (not shown) are disposed on and/or within the NMR tool 600. The motion sensor can be or include, but is not limited to, one or more accelerometers, one or more gyroscopes, one or more magnetometers, or any combination thereof. The motion sensor generates or otherwise produces readings for lateral motion of the antenna assembly 620, the magnet assembly 648, and/or the NMR tool 600. The sensor data processing unit (not shown) generates a time varying value proportional to the lateral motion of the antenna assembly 620, the magnet assembly 648, and/or the NMR tool 600. For example, the motion sensor and the sensor data processing unit are used to determine at least the lateral displacement vector (t) of the NMR tool 600 including the antenna assembly 620 and the magnet assembly 648.

A soft magnetic core, as discussed and described herein, including, but not limited to, the soft magnetic cores 230, 430, and 630, is made of a soft magnetic material that has a magnetic permeability greater than 5. Soft magnetic materials distinguish hard magnetic materials or permanent magnets used in the magnet assembly.

Figure 7:
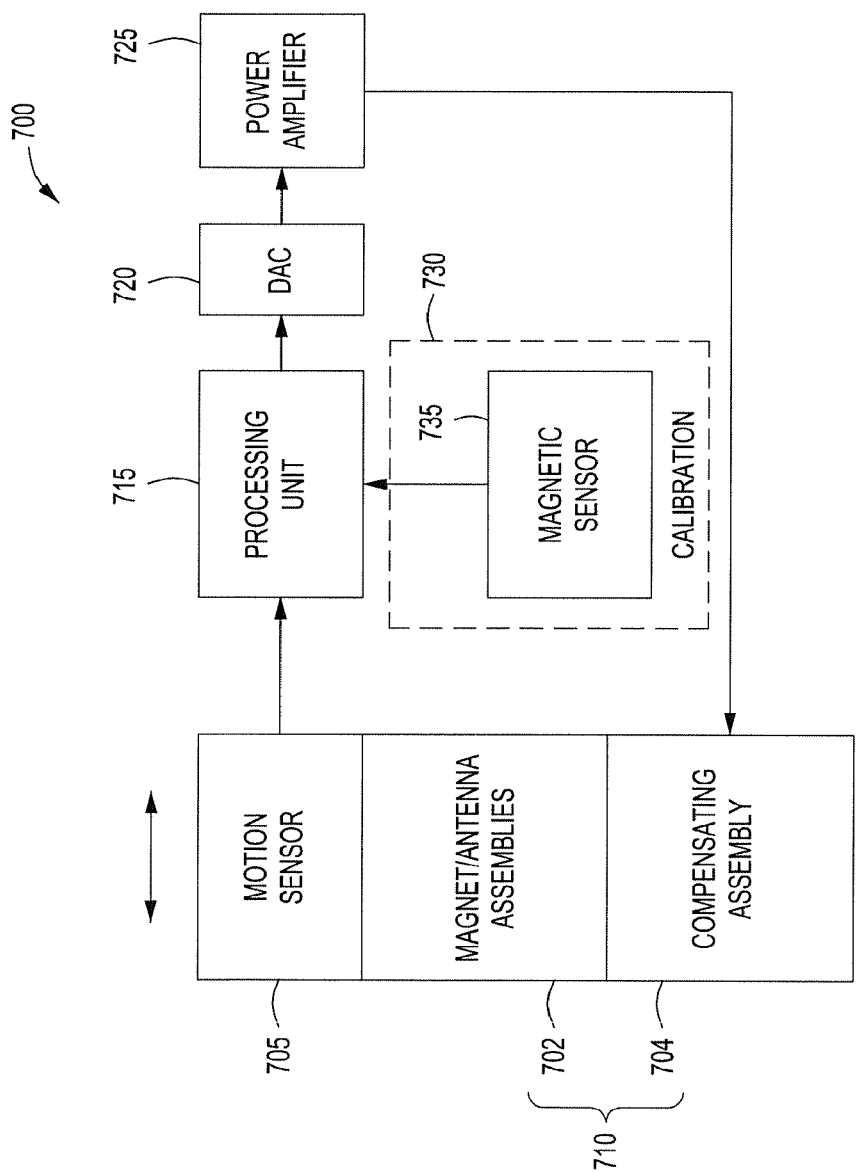
FIG. 7 illustrates a schematic block diagram of a compensating system in a calibration mode in accordance with one or more implementations.

FIG. 7 depicts a schematic block diagram of a compensating system 700 in a calibration mode in accordance with one or more implementations. The compensating system 700 can be used with a NMR tool 710 containing magnet/antenna assemblies 702 and a compensating assembly 704. The compensating system 700 can be or include any of the compensating systems 205, 405, 605. Each of the NMR tools 200, 400, 600 can include the compensating system 700. The NMR tool 710 is or includes any of the NMR tools or components thereof discussed and described herein, as well as other NMR tools. The NMR tool 710 can be or include, but is not limited to, any one of the NMR tools 200, 400, 600, as well as other NMR tools. The magnet/antenna assembly 702 can be or include, but is not limited to, the antenna assembly 220 and the magnet assembly 248, the antenna assembly 420 and the magnet assembly 448, or the antenna assembly 620 and the magnet assembly 648. The compensating assembly 704 can be or include, but is not limited to, the compensating assembly 288 or 498.

The compensating system 700 also includes one or more motion sensors 705, one or more sensor data processing units 715, a digital-to-analog converter (DAC) 720, a power amplifier 725, a calibration system 730 containing one or more magnetic field sensors 735, or any combination thereof.

The one or more motion sensors 705 are disposed on and/or within the NMR tool 710. The motion sensor 705 can be or include, but is not limited to, one or more accelerometers, one or more gyroscopes, one or more magnetometers, or any combination thereof. The sensor data processing unit 715 generates a time varying value proportional to the lateral motion of the NMR tool 710 including the magnet/antenna assemblies 702 and the compensating assembly 704. For example, the motion sensor 705 and the sensor data processing unit 715 are used to determine at least the lateral displacement vector $\vec{s}$(t) of the NMR tool 710 including the magnet/antenna assemblies 702 and the compensating assembly 704.

The DAC 720 and the power amplifier 725 are used to drive or otherwise power an upper winding in the upper electromagnet and a lower winding in the lower electromagnet within the compensating assembly 704. The sensor data processing unit 715 and the calibration system 730 containing the one or more magnetic field sensors 735 are used to calibrate the compensating assembly 704 in order to determine the coefficients $\alpha_1$ and $\alpha_2$.

By moving the NMR tool 710 including the magnet/antenna assemblies 702 and the compensating assembly 704 relative to the magnetic field sensor 735, variations of the readings of the magnetic field sensor 735 are observed and coefficient $\alpha$ (as described and discussed above) can be calculated based on the readings of the magnetic field sensor 735 and the processed motion sensor readings. After the coefficient $\alpha$ is determined and set accordingly (either digitally in the sensor data processing unit 715 and/or analogous by changing gain in the power amplifier), the magnetic field at the position of the magnetic field sensor 735 does not change in response to the lateral motion of the magnet/antenna assemblies 702. Once the system with the compensating electromagnets is calibrated, the magnetic field variation becomes substantially compensated in all the space surrounding the magnet assembly. In case the motion sensor is an accelerometer, the processing can be implemented as a double integration of the accelerometer readings.

Figure 8A:
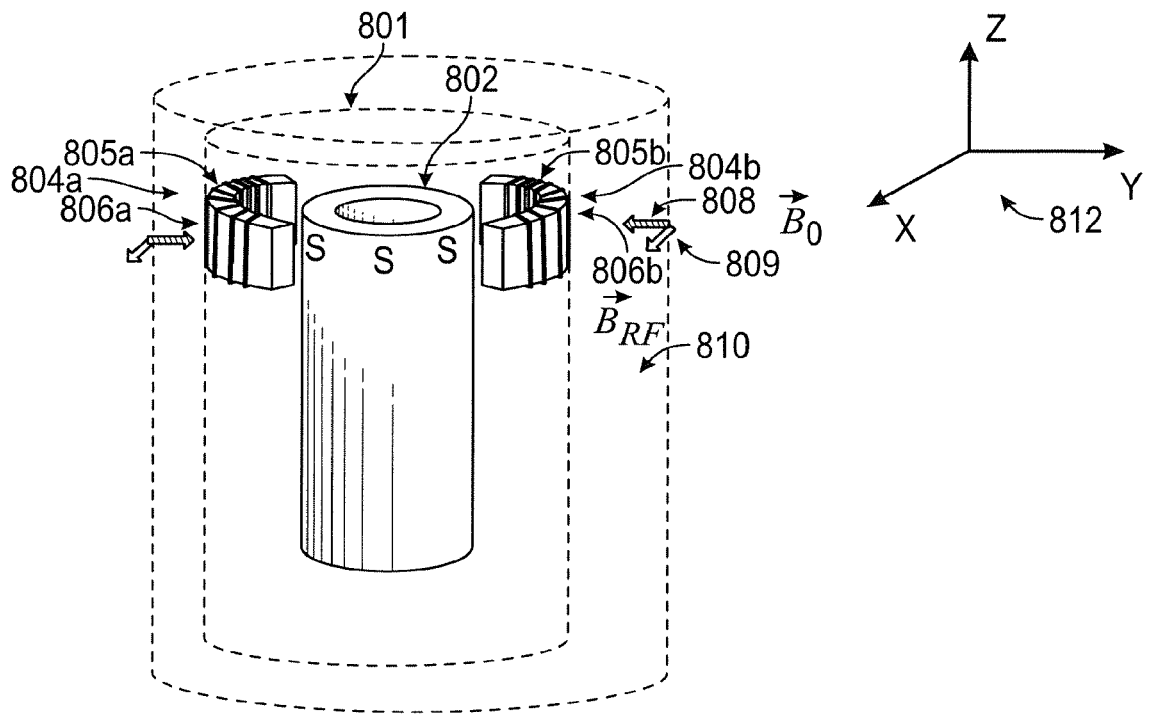
FIGS. 8A and 8B illustrate schematic views of an example of a motional sensor in accordance with one or more implementations.
Figure 8B:
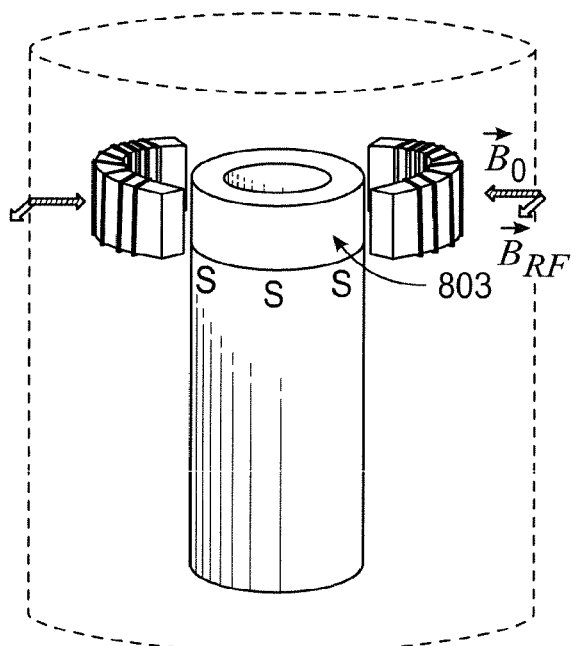

FIGS. 8A and 8B illustrate schematic views of an example of a motional sensor 801 in accordance with one or more implementations. The motional sensor 801 includes a magnetic pole 802 and two RF antennae 804*a* and 804*b*. The two antennae 804*a* and 804*b* include coils 805*a* and 805*b*, respectively, and soft magnetic cores 806*a* and 806*b*, respectively. The magnetic pole 802 may be, for example, the uppermost magnet pole of the magnet assembly of FIG. 6. In some aspects, the magnetic pole 802 corresponds to the upper end magnet 450*a* of FIG. 6. The magnetic pole 802 has a static magnetic field that has primarily a radial direction 808 near a borehole wall 809. The RF magnetic fields produced by the RF antennae (e.g., 804*a*, 804*b*) are primarily in the X direction (see coordinate system at 812) and, therefore, are orthogonal to the static magnetic field in the regions of interest near the borehole wall 809. The magnetic pole 802 generates substantially radial static magnetic field near the borehole wall 809. In some aspects, the magnetic field is axially symmetrical. Therefore, the magnetic field is homogeneous in the direction tangential to the borehole surface. In one or more implementations, the magnetic field is homogeneous in the axial direction in the excitation region exposed to the RF magnetic field. This may be desirable to make the sensitive region substantially conformal to the borehole wall 809 and, therefore, increase sensitivity to the radial (lateral) displacement of the tool. In order to improve the axial homogeneity, a shaping of the magnetic pole 802 area can be used.

In FIG. 8B, a soft magnetic pole piece 803 can be used to shape a magnetic field. As depicted in FIG. 8B, the magnetic pole piece 803 is added to the magnetic pole 802, and disposed adjacent to or in contact with the south pole of the magnetic pole 802. In this respect, the coils 805*a* and 805*b* are arranged about the magnetic pole piece 803. In one or more implementations, the magnetic pole piece 803 is formed of a metallic material, such as iron.

Figure 9:
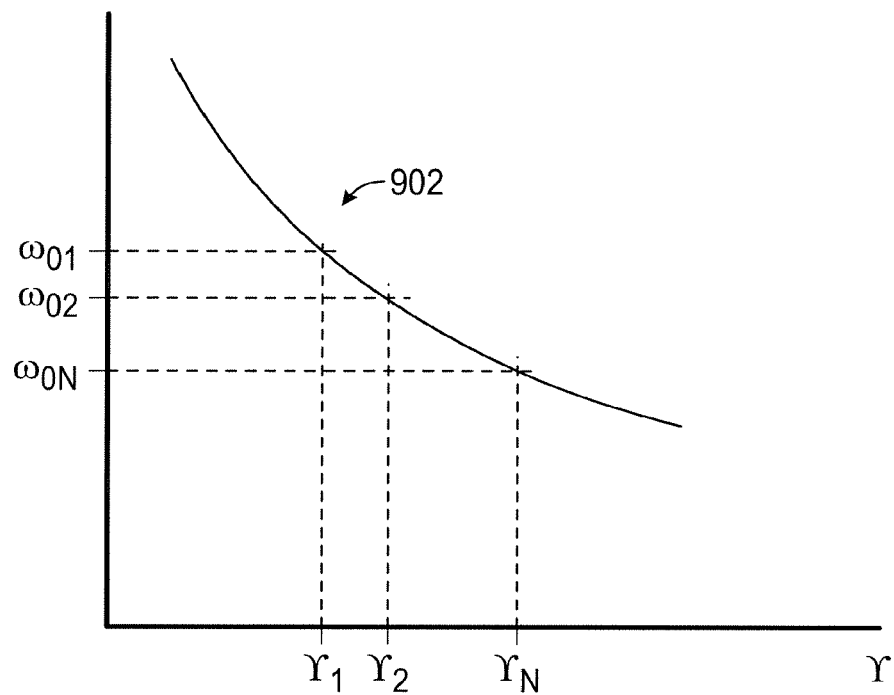
FIG. 9 illustrates a plot depicting a radially decaying static magnetic field in accordance with one or more implementations.

FIG. 9 illustrates a plot 900 depicting a radially decaying static magnetic field in accordance with one or more implementations. The magnetic pole (e.g., 802) generates a radially decaying static magnetic field as depicted, for example, in the plot 900 of FIG. 9. Due to the radial dependence, a spatial position of the NMR excitation is determined by the excitation frequency (e.g., Larmor frequency). The radial dependence of the static magnetic field and Larmor frequency of the NMR excitation are shown by curve 902 of the plot 900. The curve 902 represents a relationship between radial positions and excitation frequencies, which can be expressed as follows:

$$\omega_o(r) = \gamma B_o(r) \qquad \text{Equation (5),}$$

where $\omega_o$ is the excitation frequency, r is the radial position, $\gamma$ is the gyro-magnetic ratio, and $B_o$ is the static magnetic field.

In FIG. 9, the positions $r_1$, $r_2$, and $r_N$ of the excitation regions are shown in correspondence with the excitation frequencies $\omega_{o1}$, $\omega_{o2}$, $\omega_{oN}$, respectively. The radial extent of an excitation region is determined by the static field gradient G and the bandwidth $\Delta\omega_o$ of the excitation. Thus, the radial position r and the thickness $\Delta r$ of the NMR excitation slices are respectively defined as follows:

$$r = f\left(\frac{\omega o}{\gamma}\right), \text{ and} \qquad \text{Equation (6)}$$

$$\Delta r = \left(\frac{\Delta\omega o}{\gamma G}\right), \qquad \text{Equation (7)}$$

where f is the inverse function of the radial dependence of the static magnetic field $B_o(r)$. If a pulsed NMR excitation is used, then the bandwidth may be approximately equal to the inverse of the RF pulse width. By changing the frequency of the NMR excitation in the RF antennae (e.g., 804a, 804b), a 1D radial image can be obtained.

Figure 10:
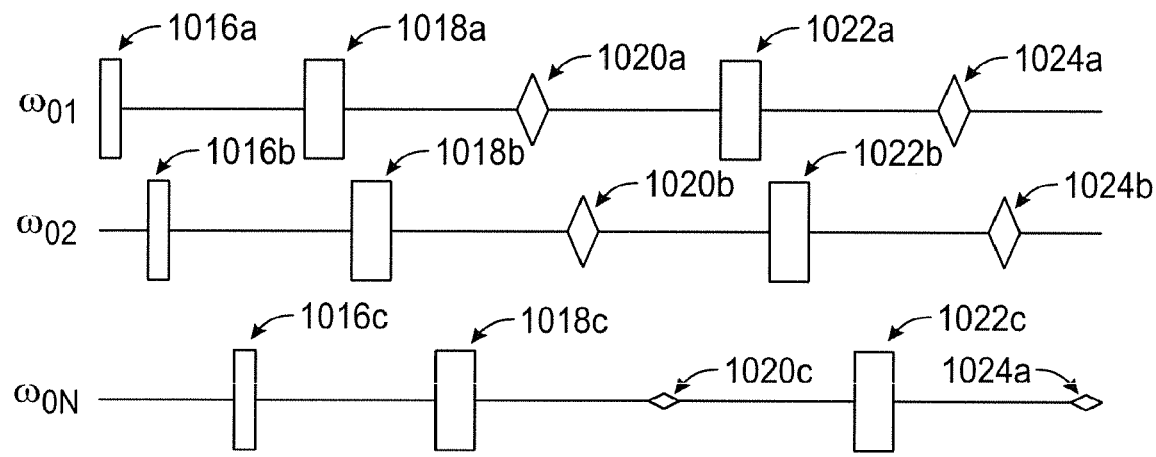
FIG. 10 illustrates a schematic view of an example of a pulse sequence enabling the 1D NMR image in accordance with one or more implementations.

FIG. 10 illustrates a schematic view of an example of a pulse sequence 1000 enabling a 1D NMR image in accordance with one or more implementations. In some implementations, the pulse sequence 1000 represents a CPMG pulse sequence. At each frequency (e.g., $\omega_{o1}$, $\omega_{o2}$, $\omega_{oN}$), the excitation and reception of the NMR signal can be one using CPMG spin echo signaling. In this respect, the CPMG pulse sequence (e.g., 1000) starts with an excitation RF pulse 1016a for a first frequency (e.g., $\omega_{o1}$). Other excitation RF pulses (e.g., 1016b, 1016c) are present at the other frequencies (e.g., $\omega_{o2}$, $\omega_{oN}$), respectively. The excitation RF pulse 1016a is followed by refocusing RF pulses 1018a, 1022a. Similarly, the other excitation RF pulses 1016b, 1016c are followed by other refocusing RF pulses (e.g., 1018b, 1018c and 1022b, 1022c), respectively. Spin echo signals 1020a, 1024a in the RF antennae (e.g., 804a, 804b) are generated between the refocusing RF pulses 1018a, 1022a, respectively. Other spin echo signals 1020b, 1024b are generated between the refocusing RF pulses 1018b, 1022b, and still other spin echo signals 1020c, 1024c are generated between the refocusing RF pulses 1018c, 1022c. Although only two refocusing RF pulses (e.g., 1018a, 1022a) are shown for each frequency, additional refocusing RF pulses can be employed (e.g., 5-10 echo sequence) to increase the signal-to-noise ratio. In some aspects, the stacked echo sequence may require about 1-2 ms for measurement. In some implementations, a broadband excitation RF pulse may cover a desired frequency band and a Fourier transform of the spin echo sequence can be used to obtain a 1D NMR image.

Figure 11:
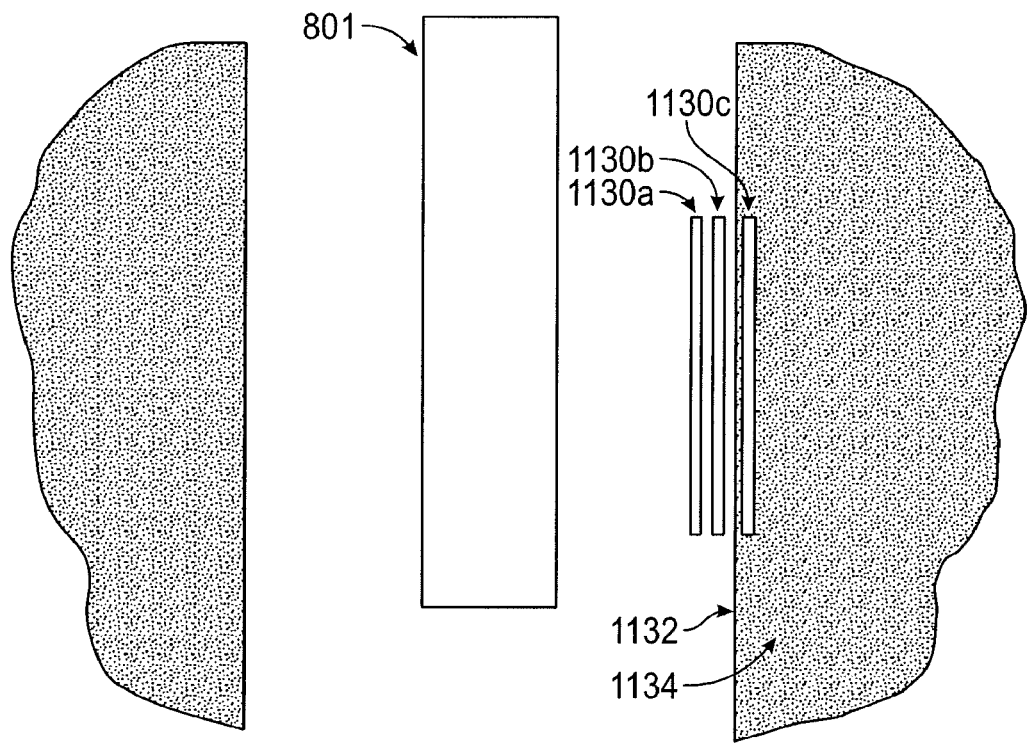
FIG. 11 illustrates a schematic cross-sectional view of excitation volumes in accordance with one or more implementations.

FIG. 11 illustrates a cross-sectional view of excitation volumes in accordance with one or more implementations. The excitation frequency step and the pulse width of the RF pulses control the spatial resolution of the 1D NMR image. In FIG. 11, there are three excitation volumes, where two excitation volumes are present in the borehole 1132 (e.g., 1130a, 1130b) and the third excitation volume (e.g., 1130c) is located in the subterranean formation 1134. The NMR signal from the borehole fluid is typically 5 to 20 times greater than the NMR signal from the earth formations. While changing the frequency and acquiring the NMR signal (e.g., in a form of a stack of the spin echo signals), the distance from the NMR sensor to the borehole wall can be determined by estimating the frequency at which a sharp drop in the NMR signal has occurred. In some implementations, a set of five frequencies may be used to cover a range of displacements of 5 mm (millimeter) with 1 mm resolution. In some aspects, this displacement range can be expected when a full gauge stabilizer with approximately 5 mm clearance between stabilizers and the borehole wall is used. In one or more implementations, only one of the two RF antennae (e.g., 804a, 804b) in a set may be sufficient for the displacement measurements. In some aspects, having tow antennae provides a benefit of reducing the required range of displacement to cover the maximum possible displacement determined by the clearance between the diameter of a full gauge stabilizer and the borehole wall.

Figure 12:
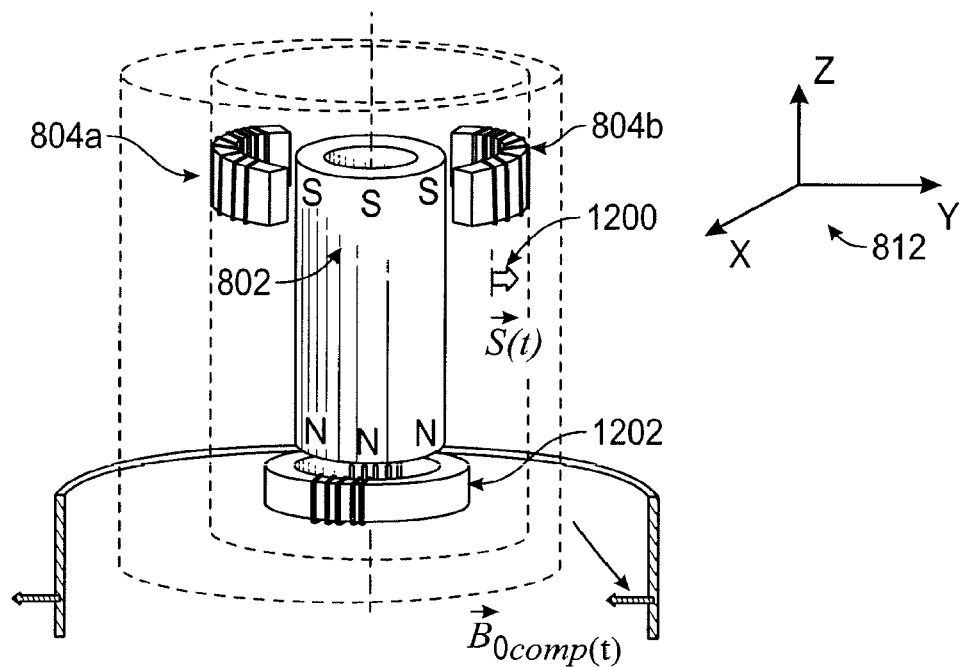
FIG. 12 illustrates a schematic diagram depicting an extended view of the motional sensor in accordance with one or more implementations.

The displacement of the NMR tool can be measured almost continuously during the NMR measurement process (e.g., a CPMG echo train used to acquire NMR properties of formations) by repeating short 1D imaging sequences (about 1-2 ms long) such as those depicted in FIG. 12. The imaging sequences can begin at the start of the NMR measurement process. Repeating the short 1D imaging sequences may require some recovery time between them in order to recover equilibrium nuclear magnetization. The recovery time may be desired to be relatively short to enable almost a continuous run of the short imaging sequences during the NMR measurement process.

In some implementations, an additional forced recovery pulse can be employed after each sequence. In order to remove measurement artifacts of NMR relaxation measurement (e.g., ringing, DC offset, etc.), an additional auxiliary refocusing pulse after the forced recovery pulse can be used to acquire only the artifacts and then subtract them from the NMR spin echo signals. In other implementations, a few short imaging sequences (e.g., at least two sequences) that begin at the start of the NMR measurement process can be used to measure the initial lateral velocity of the NMR tool, and then the displacement can be determined using an accelerometer or other mechanical sensor device (and/or mechanical sensor data).

In one or more implementations, the drill string rotation during the displacement measurement time of about 1-2 ms is insignificant and, thus, the measurement technique described in reference to FIG. 11 enables a practically instant measurement. The motional sensor 801 of FIGS. 8A and 8B illustrate a displacement measurement in one direction (e.g., parallel to Y-axis of the coordinate system 812 shown in FIG. 8A). In order to acquire a full displacement vector, a second set of RF antennae having sensitivity to displacements parallel to X-axis (e.g., 812) can be employed. The second set of RF antennae can be substantially the same as the RF antennae 804a, 804b but rotated by 90 degrees about the tool axis. An angle of the displacement vector in the coordinate system (e.g., 812) of the earth formations can be monitored using magnetometers.

In measuring the displacement of the NMR tool using the determined radial positions (e.g., $r_1$, $r_2$, and $r_N$), the motional sensor 801 can determine that the measured displacement requires active compensation when the measured displacement includes a displacement in a direction that exceeds a predetermined threshold. The compensation can be performed using the compensating assembly 698 (FIG. 6). On the other hand, the motional sensor 801 can determine that the measured displacement requires passive correction when the measured displacement includes a displacement in any direction (e.g., along the X-axis, along the Y-axis) that is smaller than a fraction of thickness of the excitation volume. The displacement vector data can be used for the NMR data correction in case of passive corrections to eliminate (or at least reduce) motional effects in the NMR data. In some implementations, numerical modeling including spin-dynamic simulations can be used to calculate the corrected NMR data.

FIG. 12 illustrates a schematic diagram depicting an extended view of the motional sensor 801 in accordance with one or more implementations. Components of the displacement vector obtained from the 1D imaging data can be converted into electrical currents driving corresponding compensating dipoles. FIG. 12 shows the motional sensor 801 with a Y-component of the displacement vector (e.g., at 804a and 804b in FIG. 12) and the corresponding compensating dipole (e.g., at 1202 in FIG. 12) with its dipole moment parallel to the Y-axis (e.g., 812) to compensate the static magnetic field change due to the Y-component of the displacement shown at 1200. FIG. 12 illustrates an upper fragment (e.g., south pole area of the upper magnet, shown at 802) of the sensor assembly with the displacement sensor (e.g., 804a, 804b). In some aspects, the compensating dipole 1202 corresponds to the upper electromagnet 500a of FIG. 6.

In order to acquire the same displacement measurement resolution (e.g., same slice thickness) while changing the frequency and, thereby, the gradient of the static magnetic field, the RF pulse width (such as the bandwidth) can be adjusted in relation to the RF pulse frequency. In one or more implementations, a propose selection of frequency steps as a function of frequency can be made to provide evenly spaced excitation volumes (or slices).

The NMR data obtained while interrogating the sensitive volumes (or slices) in the borehole (e.g., 1132) can also be used to assess NMR properties of the borehole fluids (e.g., drilling mud). The borehole fluid measurements can be performed by running a longer single frequency CPMG echo train during the time when the 1D imaging is not being performed (e.g., during between the NMR measurement processes that are run by the LWD NMR tool to measure NMR properties of formations). Thus, employing NMR displacement sensors (e.g., 801) also enable NMR characterization of the borehole fluids that can be used in interpreting the NMR logging data from the earth formations.

Figure 13:
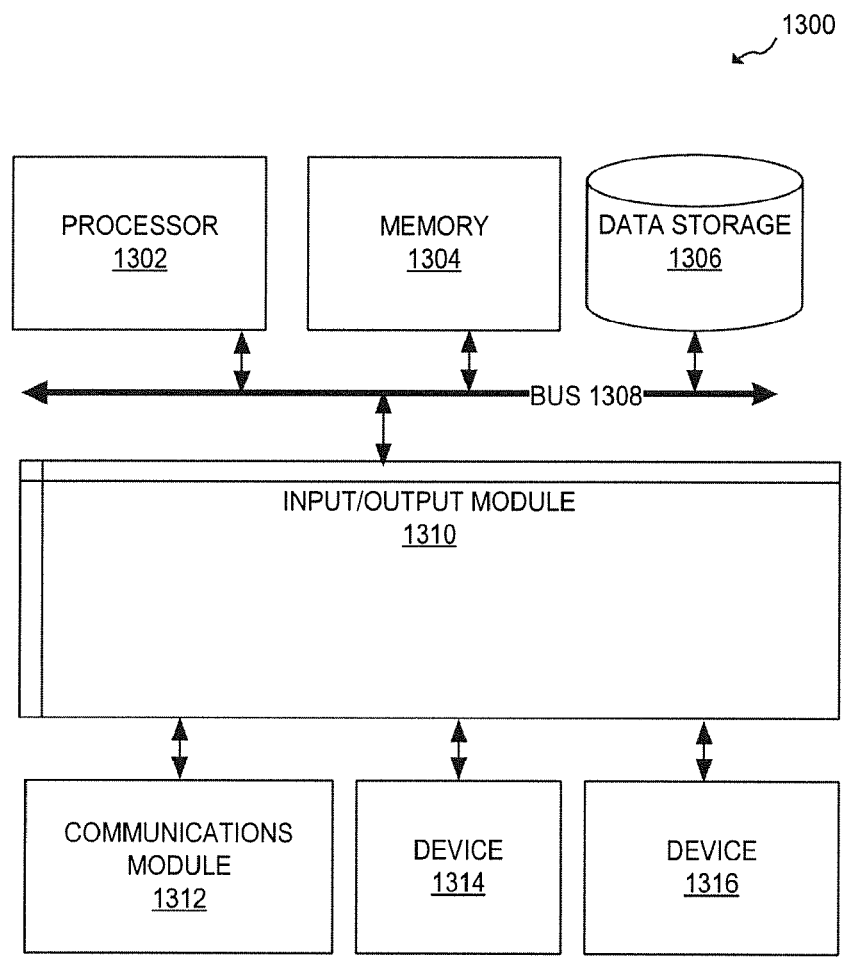
FIG. 13 is a block diagram illustrating an exemplary computer system with which the computing subsystem of FIG. 1A can be implemented.

FIG. 13 is a block diagram illustrating an exemplary computer system 1300 with which the computing subsystem 110 of FIG. 1A can be implemented. In certain aspects, the computer system 1300 may be implemented using hardware or a combination of software and hardware, either in a dedicated server, integrated into another entity, or distributed across multiple entities.

Computer system 1300 (e.g., computing subsystem 110) includes a bus 1308 or other communication mechanism for communicating information, and a processor 1302 coupled with bus 1308 for processing information. By way of example, the computer system 1300 may be implemented with one or more processors 1302. Processor 1302 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 1300 can include, in addition to hardware, code that creates an execution environment for the computer program in question, e.g., code that constitutes processor firmware, a protocol stack, a database management system, an operating system, or a combination of one or more of them stored in an included memory 1304, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1308 for storing information and instructions to be executed by processor 1302. The processor 1302 and the memory 1304 can be supplemented by, or incorporated in, special purpose logic circuitry.

The instructions may be stored in the memory 1304 and implemented in one or more computer program products, i.e., one or more modules of computer program instructions encoded on a computer readable medium for execution by, or to control the operation of, the computer system 1300, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, with languages, and xml-based languages. Memory 1304 may also be used for storing temporary variable or other intermediate information during execution of instructions to be executed by processor 1302.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1300 further includes a data storage device 1306 such as a magnetic disk or optical disk, coupled to bus 1308 for storing information and instructions. Computer system 1300 may be coupled via input/output module 1310 to various devices. The input/output module 1310 can be any input/output module. Exemplary input/output modules 1310 include data ports such as USB ports. The input/output module 1310 is configured to connect to a communications module 1312. Exemplary communications modules 1312 include networking interface cards, such as Ethernet cards and modems. In certain aspects, the input/output module 1310 is configured to connect to a plurality of devices, such as an input device 1314 and/or an output device 1316. Exemplary input devices 1314 include a keyboard and a pointing device, e.g., a mouse or a trackball, by which a user can provide input to the computer system 1300. Other kinds of input devices 1314 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback, and input from the user can be received in any form, including acoustic, speech, tactile, or brain wave input. Exemplary output devices 1316 include display devices such as a LCD (liquid crystal display) monitor, for displaying information to the user.

According to one aspect of the present disclosure, the computing subsystem 110 can be implemented using a computer system 1300 in response to processor 1302 executing one or more sequences of one or more instructions contained in memory 1304. Such instructions may be read into memory 1304 from another machine-readable medium, such as data storage device 1306. Execution of the sequences of instructions contained in the main memory 1304 causes processor 1302 to perform the process steps described herein. One or more processors in a multi-processing arrangement may also be employed to execute the sequences of instructions contained in the memory 1304. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., such as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a LAN, a WAN, the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computer system 1300 can include clients and servers. A client and server are generally remote from each other and typically interact through a communication network. The relationship of client and server arises by virtue of computer programs running on the respective computers and having a client-server relationship to each other. Computer system 1300 can be, for example, and without limitation, a desktop computer, laptop computer, or tablet computer. Computer system 1300 can also be embedded in another device, for example, and without limitation, a mobile telephone such as a smartphone.

The term "machine-readable storage medium" or "computer readable medium" as used herein refers to any medium or media that participates in providing instructions to processor 1302 for execution. Such a medium may take many forms, including, but not limited to, non-volatile media, volatile media, and transmission media. Non-volatile media include, for example, optical or magnetic disks, such as data storage device 1306. Volatile media include dynamic memory, such as memory 1304. Transmission media include coaxial cables, copper wire, and fiber optics, including the wires that comprise bus 1308. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

Various examples of aspects of the disclosure are described below. These are provided as examples, and do not limit the subject technology.

In an embodiment of the present disclosure, a NMR tool includes an antenna assembly comprising an antenna winding at least partially disposed around a soft magnetic core comprising an upper axial end opposite a lower axial end. The NMR tool includes a magnet assembly comprising an upper end magnet spaced apart from the upper axial end of the soft magnetic core and a lower end magnet spaced apart from the lower axial end of the soft magnetic core. The NMR tool also includes a motional sensor comprising at least one radio frequency (RF) antenna disposed about a tool axis and about at least a portion of the upper end magnet, in which the motional sensor is operable to generate readings for lateral motion of the antenna assembly and the magnet assembly. In some aspects, the motional sensor determines a one-dimensional NMR image indicating a lateral displacement of the NMR tool based on one or more spatial positions of NMR excitation volumes in a region of interest that correspond to respective excitation frequencies in the at least one RF antenna.

In an embodiment of the present disclosure, a method of obtaining NMR data in a wellbore includes introducing a NMR tool into the wellbore, in which the NMR tool includes an antenna assembly, a magnet assembly, and a motional sensor. The motional sensor includes at least one radio frequency (RF) antenna disposed about a tool axis and about at least a portion of the magnet assembly, in which the motional sensor is operable to generate readings due to lateral motion of the antenna assembly and the magnet assembly. The method includes producing a static magnetic field using the magnet assembly, and applying a pulse sequence to a region of interest for one or more excitation frequencies in the at least one RF antenna. The method also includes moving the NMR tool through the wellbore, and measuring NMR data via the NMR tool. The method includes acquiring one or more NMR echo signals for each of the one or more excitation frequencies from the measured NMR data, and determining a radial position of each excitation volume associated with one of the one or more excitation frequencies from the acquired one or more NMR echo signals. The method also includes reducing an effect of the lateral motion on the NMR data by operating the motional sensor to produce a one-dimensional NMR image from the determined radial positions.

In an embodiment of the present disclosure, a system for downhole logging includes a NMR tool for use in a wellbore, in which the NMR tool includes an antenna assembly comprising an antenna winding at least partially disposed around a soft magnetic core comprising an upper axial end opposite a lower axial end. The NMR tool also includes a magnet assembly comprising an upper end magnet spaced apart from the upper axial end of the soft magnetic core and a lower end magnet spaced apart from the lower axial end of the soft magnetic core. The NMR tool also includes a motional sensor comprising at least one radio frequency (RF) antenna disposed about a tool axis and about at least a portion of the upper end magnet, in which the motional sensor is operable to generate readings for lateral motion of the antenna assembly and the magnet assembly. The motional sensor determines a one-dimensional NMR image from the generated lateral motion readings, in which the one-dimensional NMR image indicates a lateral displacement of the NMR tool based on one or more spatial positions of NMR excitation volumes in a subterranean region of interest that correspond to respective excitation frequencies in the at least one RF antenna.

In one or more aspects, examples of clauses are described below.

A method comprising one or more methods, operations or portions thereof described herein.

An apparatus comprising one or more memories and one or more processors (e.g., 1300), the one or more processors configured to cause performing one or more methods, operations or portions thereof described herein.

An apparatus comprising one or more memories (e.g., 1304, one or more internal, external or remote memories, or one or more registers) and one or more processors (e.g., 1302) coupled to the one or more memories, the one or more processors configured to cause the apparatus to perform one or more methods, operations or portions thereof described herein.

An apparatus comprising means (e.g., 1300) adapted for performing one or more methods, operations or portions thereof described herein.

A processor (e.g., 1302) comprising modules for carrying out one or more methods, operations or portions thereof described herein.

A hardware apparatus comprising circuits (e.g., 1300) configured to perform one or more methods, operations or portions thereof described herein.

An apparatus comprising means (e.g., 1300) adapted for performing one or more methods, operations or portions thereof described herein.

An apparatus comprising components (e.g., 1300) operable to carry out one or more methods, operations or portions thereof described herein.

A computer-readable storage medium (e.g., 1304, one or more internal, external or remote memories, or one or more registers) comprising instructions stored therein, the instructions comprising code for performing one or more methods or operations described herein.

A computer-readable storage medium (e.g., 1304, one or more internal, external or remote memories, or one or more registers) storing instructions that, when executed by one or more processors, cause one or more processors to perform one or more methods, operations or portions thereof described herein.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the subject technology. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order.

It should be understood that the described instructions, operations, and systems can generally be integrated together in a single software/hardware product or packaged into multiple software/hardware products.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

Therefore, the subject technology is well adapted to attain the ends and advantages mentioned as well as those that are inherent therein. The particular embodiments disclosed above are illustrative only, as the subject technology may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the subject technology. The subject technology illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

What is claimed is:

1. A method of obtaining nuclear magnetic resonance (NMR) data in a well bore, comprising:
   introducing a NMR tool into the wellbore, wherein the NMR tool comprises a motional sensor operable to generate readings due to lateral motion;
   producing a static magnetic field;
   using an RF antenna of the motional sensor, applying an RE pulse sequence to a plurality of excitation volumes in a region of interest including the wellbore, wherein applying the pulse sequence comprises applying a plurality of imaging sequences, each of the plurality of imaging sequences comprising an excitation RF pulse and a plurality of refocusing RF pulses, and applying a forced recovery pulse between each of the plurality of imaging sequences to provide a recovery in equilibrium nuclear magnetization;
   applying an auxiliary refocusing pulse subsequent to the forced recovery pulse, the auxiliary refocusing pulse being operable to remove measurement artifacts from the measured NMR data;
   acquiring one or more NMR echo signals for each of the plurality of excitation volumes, wherein at least one of the NMR echo signals is acquired from fluid in the wellbore;
   generating a one-dimensional image of the region of interest in order to determine a lateral displacement of the NMR tool inside the wellbore; and
   using the one-dimensional image to reduce the effect of the lateral displacement on the NMR data.

2. The method of claim 1, wherein deter mining the radial position of each excitation volume comprises:
   determining a radial length of the excitation volume based on a gradient of the static magnetic field and a bandwidth of the associated excitation frequency.

3. The method of claim 1, wherein producing the static magnetic field comprises:
   producing a radially decaying static magnetic field in the region of interest, wherein the radially decaying static magnetic field has a first magnitude at a first spatial position for a first excitation frequency and a second magnitude smaller than the first magnitude at a second spatial position for a second excitation frequency, wherein a first distance between the NMR tool and the first spatial position is smaller than a second distance between the NMR tool and the second spatial position, and wherein the first excitation frequency is greater than the second excitation frequency.

4. The method of claim 1, wherein the generating of the one-dimensional image comprises:
 changing an excitation frequency of the RF pulse sequence and measuring each of the acquired NMR signals corresponding to the respective excitation volumes;
 while changing the frequency and acquiring the NMR signals, determining the frequency at which a change in the acquired NMR signals exceeds a predetermined threshold, the frequency corresponding to the radial position of the respective excitation volume being at or beyond a wall of the wellbore; and
 deter mining a distance from the NMR tool to the wall of the wellbore based on the radial position of the excitation volume associated with the determined frequency.

5. The method of claim 1, wherein applying the pulse sequence comprises: applying an excitation RF pulse; and
 applying a plurality of refocusing RF pulses subsequent to the excitation RE pulse, wherein each of the one or more NMR echo signals is generated between the plurality of refocusing RF pulses.

6. The method of claim 1, further comprising:
 measuring a displacement in the NMR tool using the determined radial positions;
 determining that the measured displacement requires active compensation when the measured displacement comprises a displacement in a direction that exceeds a predetermined threshold; and
 determining that the measured displacement requires passive correction when the measured displacement comprises a displacement in any direction that is smaller than a fraction of thickness of the excitation volume.

\* \* \* \* \*

UNITED STATES PATENT AND TRADEMARK OFFICE
CERTIFICATE OF CORRECTION

| | |
|---|---|
| PATENT NO. | : 11,441,414 B2 |
| APPLICATION NO. | : 16/336865 |
| DATED | : September 13, 2022 |
| INVENTOR(S) | : Arcady Reiderman |

It is certified that error appears in the above-identified patent and that said Letters Patent is hereby corrected as shown below:

In the Claims

Claim 2 at Column 24, Line 52, change "deter mining" to --determining--.

Claim 4 at Column 25, Line 15, change "deter mining" to --determining--.

Claim 5 at Column 26, Line 4, change "RE pulse" to --RF pulse--.

Signed and Sealed this
Twenty-fifth Day of October, 2022

Katherine Kelly Vidal
*Director of the United States Patent and Trademark Office*